United States Patent [19]

Kunita et al.

[11] Patent Number: 5,703,140

[45] Date of Patent: Dec. 30, 1997

[54] PHOTOPOLYMERIZABLE COMPOSITION

[75] Inventors: Kazuto Kunita; Syunichi Kondo, both of Shizuoka, Japan

[73] Assignee: Fuji Photo Film Co., Ltd., Minami Ashigara, Japan

[21] Appl. No.: 589,992

[22] Filed: Jan. 23, 1996

[30] Foreign Application Priority Data

Jan. 30, 1995 [JP] Japan ................. 7-13108

[51] Int. Cl.$^6$ ............. G03F 7/028; C08F 2/50
[52] U.S. Cl. ............ 522/57; 522/26; 522/27; 522/28; 522/173; 522/121; 522/126; 428/457; 430/278.1; 430/281.1
[58] Field of Search ............ 522/26, 57, 173, 522/121, 126

[56] References Cited

U.S. PATENT DOCUMENTS

| 4,590,145 | 5/1986 | Itoh et al. | 430/281 |
|---|---|---|---|
| 5,459,216 | 10/1995 | Bott et al. | 526/311 |
| 5,514,762 | 5/1996 | Bott et al. | 526/301 |

FOREIGN PATENT DOCUMENTS

| 1576141 | 7/1969 | France . |
|---|---|---|
| 2400222 | 3/1979 | France . |

OTHER PUBLICATIONS

T.S.V. Buys et al., "Photochemistry of Alpha–oxo–oximes", Chemical Abstracts, vol. 114, No. 6, Feb. 11, 1991, p. 654.

*Primary Examiner*—Susan W. Berman
*Attorney, Agent, or Firm*—Burns, Doane, Swecker & Mathis, LLP

[57] ABSTRACT

A photopolymerizable composition is disclosed, comprising at least (i) a compound having an addition-polymerizable ethylenically unsaturated bond, and (ii) an oxime ether compound. The photopolymerizable composition of the present invention shows high sensitivity to active light rays over a wide range of from ultraviolet ray to visible light and at the same time, the photosensitive material using the photopolymerizable composition of the present invention is improved in the storage stability. Further, the development precipitate generated from the developer waste after development of the photosensitive material is restrained.

3 Claims, No Drawings

5,703,140

PHOTOPOLYMERIZABLE COMPOSITION

FIELD OF THE INVENTION

The present invention relates to a photopolymerizable composition, more particularly, it relates to a photopolymerizable composition containing a photopolymerizable compound having at least an addition-polymerizable ethylenically unsaturated bond and an oxime ether compound.

BACKGROUND OF THE INVENTION

A copying method of an image using a photosensitive composition having mixed therein a compound having an addition-polymerizable ethylenically unsaturated bond, a photopolymerization initiator and if desired, a binder having an appropriate film-forming ability and a thermal polymerization inhibitor, by means of a photographic means has been conventionally known and examples of the method are described in U.S. Pat. Nos. 2,927,022, 2,902,356 and 3,870,524. As described in these U.S. patents, this kind of photosensitive composition undergoes photopolymerization upon light irradiation, whereby the composition is cured and insolubilized, and accordingly, a cured image of a desired photopolymerizable composition can be formed by processing the photosensitive composition into an appropriate film, irradiating thereon light through a desired negative image and removing only the unexposed area by an appropriate solvent (hereinafter simply referred to as development). This type of photosensitive composition is very useful for the use in the production of a printing plate and the like.

Also, since sufficient photosensitivity cannot be achieved only with the compound having an addition-polymerizable ethylenically unsaturated bond, it has been conventionally recommended to add a photopolymerization initiator so as to elevate the photosensitive property and benzene, benzoin, benzoin ethylether, Michler's ketone, anthraquinone, acridine, phenazine, benzophenone and 2-ethyl anthraquinone are used as a photopolymerization initiator. However, the photopolymerizable composition using such a photopolymerization initiator is low in the sensibility to curing and therefore, image exposure in the image formation process requires a long period of time. As a result, in forming a miniature image, an image of good quality cannot be reproduced when occurred even slight vibration at the operation and further, since the energy radiant quantities of a light source upon exposure must be increased, a large quantity of exothermic radiation attending thereon needs to be taken into consideration. In addition, a problem is present such that the film of the composition is readily deformed or denatured due to heat.

In recent years, a method for achieving high sensitivity to ultraviolet rays or for forming an image using a laser is being investigated and a UV projection exposure method, a laser direct plate making, a laser facsimile and a holography for forming a printing plate are already put into practical use. So, a high-sensitivity photosensitive material capable of coping with such techniques is demanded and now being developed. However, a photosensitive material having a sensitivity on a satisfactory level has not yet been found.

SUMMARY OF THE PRESENT INVENTION

An object of the present invention is to provide a high-sensitivity photopolymerizable composition, more specifically, a photopolymerizable composition containing a compound capable of increasing photopolymerization rate of a photopolymerizable composition containing a compound having an addition-polymerizable ethylenically unsaturated bond.

As a result of intensive investigations to achieve the above-described object, the present inventors have found that an oxime ether compound remarkably increases the photopolymerization rate of a compound having an addition-polymerizable ethylenically unsaturated bond and the present invention has been accomplished based on this finding.

The use of an oxime ether compound is accompanied by other good effects such that the storage stability of the photosensitive material is improved and the development precipitate from the developer waste after development of a photosensitive material is restrained.

The present invention provides a photopolymerizable composition comprising at least the following components (i) and (ii):

(i) a compound having an addition-polymerizable ethylenically unsaturated bond, and (ii) an oxime ether compound.

DETAILED DESCRIPTION OF THE INVENTION

Each component of the photopolymerizable composition of the present invention is described below in detail.

The compound having an addition-polymerizable ethylenically unsaturated bond as component (i) for use in the present invention is selected from the compounds having at least one, preferably two or more terminal ethylenically unsaturated bonds.

Examples of the monomer include an ester of an unsaturated carboxylic acid (e.g., acrylic acid, methacrylic acid, itaconic acid, crotonic acid, isocrotonic acid, maleic acid) with an aliphatic polyhydric alcohol compound and an amide of the above-described unsaturated carboxylic acid with an aliphatic polyhydric amine compound.

Specific examples of the monomer which is the ester of an aliphatic polyhydric alcohol compound with an unsaturated carboxylic acid include:

as an acrylic ester, ethylene glycol diacrylate, triethylene glycol diacrylate, 1,3-butandiol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer;

as a methacrylic ester, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(acryloyloxyethoxy)phenyl]dimethylmethane;

as an itaconic ester, ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

as a crotonic ester, ethylene glycol dicrotonate, tetramethylene glycol dicrotonate, pentaerythritol dicrotonate and sorbitol tetradicrotonate;

as an isocrotonic ester, ethylene glycol diisocrotonate, pentaerythritol diisocrotonate and sorbitol tetraisocrotonate;

as a maleic ester, ethylene glycol dimaleate, triethylene glycol dimaleate, pentaerythritol dimaleate and sorbitol tetramaleate; and a mixture of these ester monomers.

Specific examples of the monomer which is the amide of an aliphatic polyhydric amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriamine-trisacrylamide, xylylenebisacrylamide, xylylenebis-methacrylamide.

Other examples include a vinylurethane compound having two or more polymerizable vinyl groups in one molecule resulting from adding a vinyl monomer having a hydroxyl group represented by the following formula (A) to a polyisocyanate compound having two or more isocyanate groups in one molecule described in JP-B-48-41708 (the term "JP-B" as used herein means an "examined Japanese patent publication"):

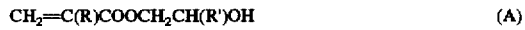

$$CH_2=C(R)COOCH_2CH(R')OH \quad (A)$$

(wherein R and R' each represents H or $CH_3$).

Further, polyfunctional acrylates and methacrylates such as urethane acrylates described in JP-A-51-37193 (the term "JP-A" as used herein means an "unexamined published Japanese patent application"), polyester acrylates described in JP-A-48-64183, JP-B-49-43191 and JP-B-52-30490 and epoxy acrylates resulting from reacting an epoxy resin with a (meth)acrylic acid may be used. Also, those described in Nippon Secchaku Kyokai-shi, vol. 20, No. 7, pp. 300–308 (1984) as a photo-curable monomer or oligomer may be used. These monomers may be used in the chemical form of a prepolymer, namely, a dimer, a trimer or an oligomer, a mixture of these or a copolymer thereof.

The use amount of the compound as component (i) is from 5 to 50 wt % (hereinafter simply referred to as "%"), preferably from 10 to 40%, based on all components of the photopolymerizable composition. If the use amount exceeds 50%, film formation failure (stickiness) is caused, whereas if it is less than 5%, curing failure is caused, thus these are not preferred.

The oxime ether compound as component (ii) for use in the present invention is a compound represented by the following formula (I):

$$(R^1)(R^2)C=N-O-R^3 \quad (I)$$

wherein $R^1$, $R^2$ and $R^3$, which may be the same or different, each represents a monovalent organic residue.

In formula (I), $R^1$ and $R^2$, which may be the same or different, each preferably represents a hydrogen atom, a halogen atom, a hydrocarbon group which may contain a substituent and at the same time, may have an unsaturated bond, a heterocyclic group, a hydroxyl group, a substituted oxy group, a mercapto group, a substituted thio group, an amino group, a substituted amino group, a substituted carbonyl group, a carboxylate group, a sulfo group, a sulfonate group, a substituted sulfinyl group, a substituted sulfonyl group, a phosphono group, a substituted phosphono group, a phosphonate group, a substituted phosphonate group, a cyano group or a nitro group, and $R^1$ and $R^2$ may be combined with each other to form a ring.

$R^3$ represents a hydrocarbon group which may have a substituent and at the same time, may contain an unsaturated bond, or a heterocyclic group, and $R^3$ and $R^2$ may be combined with each other to form a ring.

Examples of $R^1$, $R^2$ and $R^3$ in formula (I) are described below. The hydrocarbon group which may have a substituent and at the same time, may contain an unsaturated bond includes an alkyl group, a substituted alkyl group, an aryl group, a substituted aryl group, an alkenyl group, a substituted alkenyl group, an alkynyl group and a substituted alkynyl group.

The alkyl group includes a linear, branched or cyclic alkyl group having from 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, preferred are a linear alkyl group having from 1 to 12 carbon atoms, a branched alkyl group having from 3 to 12 carbon atoms and a cyclic alkyl group having from 5 to 10 carbon atoms.

The substituted alkyl group is constructed by bonding a substituent to an alkylene group and the substituent for the substituted alkyl group is a monovalent nonmetallic atom group exclusive of hydrogen. Preferred examples of the substituent include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugate base group thereof (hereinafter called a carboxylate), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter called a sulfonate group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group (—$SO_2NHSO_2$(alkyl)) and a conjugate base group thereof, an N-arylsulfonylsulfamoyl group (—$SO_2NHSO_2$(allyl)) and a conjugate base group thereof, an N-alkylsulfonylcarbamoyl group (—$CONHSO_2$(alkyl)) and a conjugate base group thereof, an N-arylsulfonylcarbamoyl group (—$CONHSO_2$(allyl)) and a conjugate base group thereof, an alkoxysilyl group (—$Si(Oalkyl)_3$), an aryloxysilyl group (—$Si(Oallyl)_3$), a hydroxysilyl group (—$Si(OH)_3$) and a conjugate base group thereof, a phosphono group (—$PO_3H_2$) and a conjugate base group thereof (hereinafter called a phosphonate group), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and a conjugate base group thereof (hereinafter called an alkyl phosphonate group), a monoarylphosphono group (—$PO_3H$(aryl)) and a conjugate base group thereof (hereinafter called an aryl phosphonate group), a phosphonooxy group (—$OPO_3H_2$) and a conjugate base group thereof (hereinafter called a phosphonate oxy group), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and a conjugate base group thereof (hereinafter called an alkyl phosphonate oxy group), a monoarylphosphonooxy group (—$OPO_3H$(aryl)) and a conjugate base group thereof (hereinafter called an aryl phosphonate oxy group), a cyano group, a nitro group, an aryl group, an alkenyl group and an alkynyl group. Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a fluorophenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a nitrophenyl group, a cyanophenyl group, a sulfophenyl group, a sulfonate phenyl group, a phosphonophenyl group and a phosphonate phenyl group. Examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group, a trimethylsilylethynyl group and a phenylethynyl group.

The acyl group ($R^4CO$—) includes those where $R^4$ is a hydrogen atom or the above-described alkyl, aryl, alkenyl or alkynyl group. The alkylene group in the substituted alkyl group includes a divalent organic residue resulting from eliminating any one of hydrogen atoms on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, a methoxycarbonylmethyl group, a methoxycarbonylbutyl group, an ethoxycarbonylmethyl group, a butoxycarbonylmethyl group, an allyloxycarbonylmethyl group, a benzyloxycarbonylmethyl group, a methoxycarbonylphenylmethyl group, a trichloromethylcarbonylmethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfopropyl group, a sulfobutyl group, a sulfonate butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group,

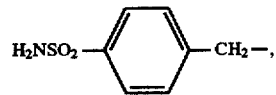

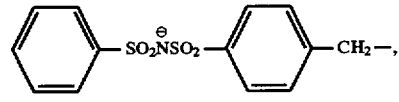

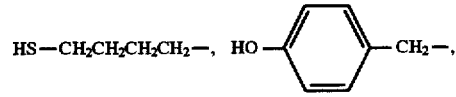

a phosphonobutyl group, a phosphonate hexyl group, a diethylphosphonobutyl group, a diphenylphosphonopropyl group, a methylphosphonobutyl group, a methyl phosphonate butyl group, a tolylphosphonohexyl group, a tolyl phosphonate hexyl group, a phosphonooxypropyl group, a phosphonate oxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group includes a condensed ring formed by from 1 to 3 benzene rings and a condensed ring formed by a benzene ring and a 5-membered unsaturated ring and specific examples include a phenyl group, a naphthyl group, an anthryl group, a phenanthryl group, an indenyl group, an acenaphthenyl group and a fluorenyl group, with the phenyl group and the naphthyl group being preferred.

The substituted aryl group is constructed by bonding a substituent to an aryl group and includes those having a monovalent nonmetallic atom group exclusive of hydrogen as a substituent on the ring-forming carbon atoms of the above-described aryl group. Preferred examples of the substituent include the above-described alkyl groups, substituted alkyl groups and substituents for the substituted alkyl group. Preferred specific examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, a phenylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl) carbamoylphenyl group, an N-methyl-N-(sulfophenyl) carbamoylphenyl group, a sulfophenyl group, a sulfonate phenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonate phenyl group, a diethylphosphonophenyl group, a diphenylphosphonophenyl group, a methylphosphonophenyl group, a methyl phosphonate phenyl group, a tolylphosphonophenyl group, a tolyl phosphonate phenyl group, an allyl group, a 1-propenylmethyl group, 2-butenyl group, a 2-methylallylphenyl group, a 2-methylpropenylphenyl group, a 2-propynylphenyl group, a 2-butynylphenyl group and a 3-butynylphenyl group.

The alkenyl group includes those described above. The substituted alkenyl group is constructed by substituting a substituent for the hydrogen atom on the alkenyl group to bond to the alkenyl group. Examples of the substituent include substituents for the above-described substituted alkyl group and the alkenyl group include the alkenyl groups described above.

Preferred examples of the substituted alkenyl group include:

$CH_3O_2CCH_2CH=CHCH_2-$, $CH_3C(CO_2CH_3)=CH-CH_2-$, $HO_2CCH_2CH=CHCH_2-$,

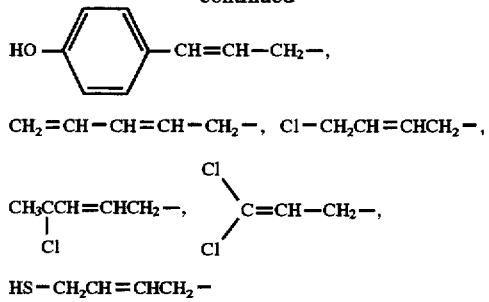

$CH_2=CH-CH=CH-CH_2-$, $Cl-CH_2CH=CHCH_2-$,

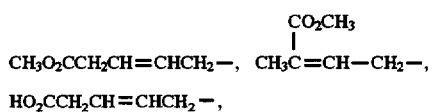

$HS-CH_2CH=CHCH_2-$

The alkynyl group include those described above. The substituted alkynyl group is constructed by substituting a substituent for the hydrogen atom on the alkynyl group to bond to the alkynyl group. Examples of the substituent include substituents for the substituted alkyl group and the alkynyl group described above.

The heterocyclic group includes a monovalent group resulting from eliminating one hydrogen on the heterocyclic ring and a monovalent group (substituted heterocyclic group) resulting from further eliminating one hydrogen from the above-described monovalent group and bonding therefor a substituent such as those described above for the substituted alkyl group.

Preferred examples of the heterocyclic ring include:

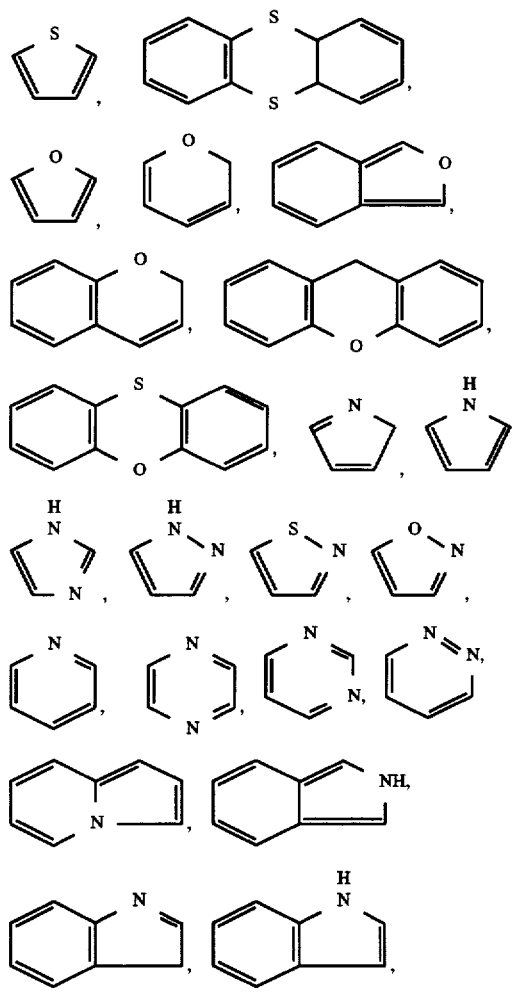

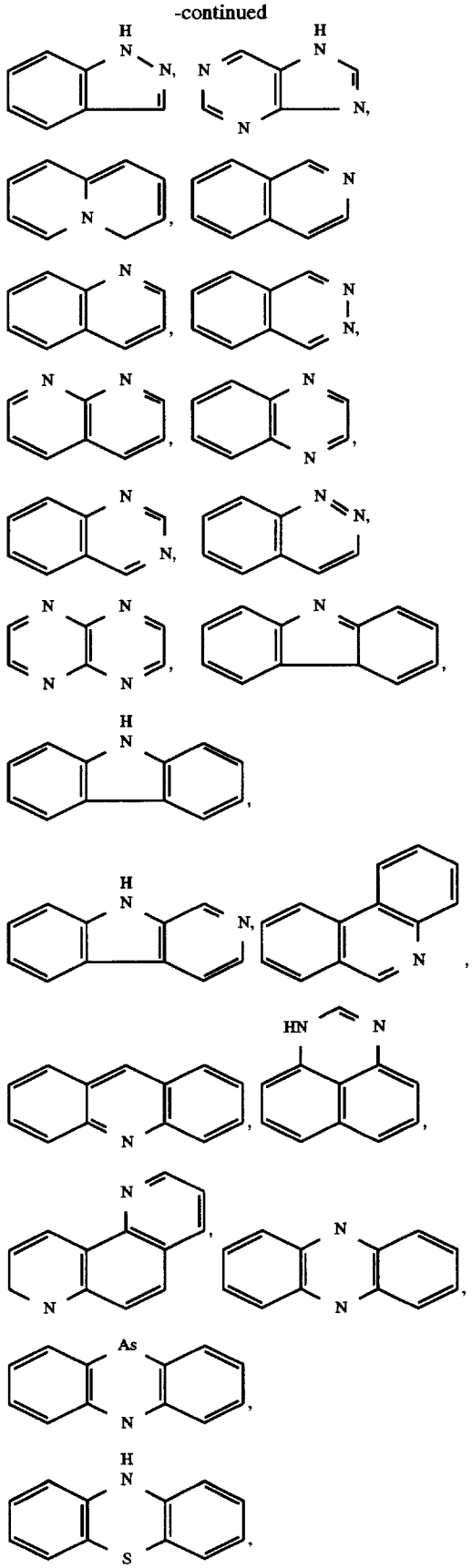
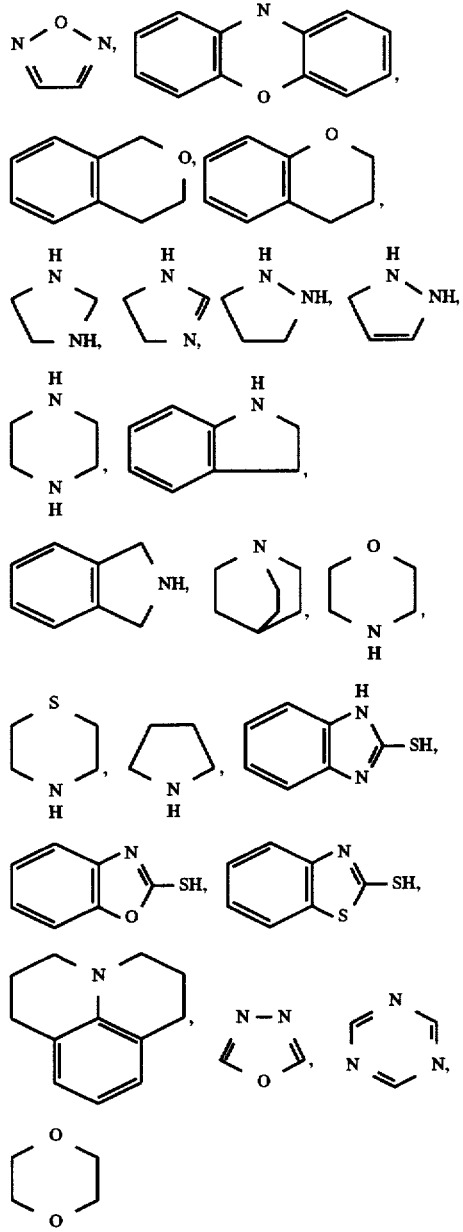

The substituted oxy group ($R^5O$—) includes those where $R^5$ is a monovalent nonmetallic atom group exclusive of hydrogen. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group and a phosphonate oxy group. The alkyl group and the aryl group in these groups include those described above for the alkyl group and the substituted alkyl group and those for the aryl group and the substituted aryl group, respectively. The acyl group ($R^6O$—) in the acyloxy group include those where $R^6$ is the above-described alkyl group, substituted alkyl group, aryl group or substituted aryl group. Among these substituents, more preferred are an alkoxy group, an aryloxy group, an acyloxy group and an arylsulfoxy group.

Preferred specific examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group and a phosphonate oxy group.

The substituted thio group ($R^7S$—) includes those where $R^7$ is a monovalent nonmetallic atom group exclusive of hydrogen. Preferred examples of the substituted thio group include an alkylthio group, an arylthio group, an alkyldithio group, an aryldithio group and an acylthio group. The alkyl group or the aryl group in these groups includes those described above for the alkyl group and the substituted alkyl group and those for the aryl group and the substituted aryl group, respectively. $R^6$ of the acyl group ($R^6CO$—) in the acylthio group has the same meaning as defined above. Among these, an alkylthio group and an arylthio group are more preferred. Preferred specific examples of the substituted thio group include a methylthio group, an ethylthio group, a phenylthio group, an ethoxyethylthio group, a carboxyethylthio group and a methoxycarbonylthio group.

The substituted amino group ($R^8NH$—, ($R^9$)($R^{10}$)N—) include those where $R^8$, $R^9$ and $R^{10}$ each is a monovalent nonmetallic atom group exclusive of hydrogen. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and the aryl group in these groups includes those described above for the alkyl group and the substituted alkyl group and those for the aryl group and the substituted aryl group, respectively, and $R^6$ of the acyl group ($R^6CO$—) in the acylamino group, the N-alkylacylamino group and the N-arylacylamino group has the same meaning as defined above. Among these groups, more preferred are an N-alkylamino group, an N,N-dialkylamino group, an N-arylamino group and an acylamino group. Preferred specific examples of the substituted amino group include a methylamino group, an ethylamino group, a diethylamino group, a morpholino group, a piperidino group, a pyrrolidino group, a phenylamino group, a benzoylamino group and an acetylamino group.

The substituted carbonyl group ($R^{11}$—CO—) includes those where $R^{11}$ is a monovalent nonmetallic atom group. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group and the aryl group in these groups includes those described above for the alkyl group and the substituted alkyl group and those for the aryl group and the substituted aryl group, respectively. Among these, more preferred are a formyl group, an acyl group, a carboxyl group, an alkoxycarbonyl group, an aryloxycarbonyl group, a carbamoyl group, an N-alkylcarbamoyl group, an N,N-dialkylcarbamoyl group or an N-arylcarbamoyl group, still more preferred are a formyl group, an acyl group, an alkoxycarbonyl group and an aryloxycarbonyl group. Specific examples of preferred substituents include a formyl group, an acetyl group, a benzoyl group, a carboxyl group, a methoxycarbonyl group, an allyloxycarbonyl group, an N-methylcarbamoyl group, an N-phenylcarbamoyl group, an N,N-diethylcarbamoyl group and a morpholinocarbonyl group.

The substituted sulfinyl group ($R^{12}$—SO—) includes those where $R^{12}$ is a monovalent nonmetallic atom group. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. The alkyl group and the aryl group in these groups includes those described above for the alkyl group and the substituted alkyl group and those for the aryl group and the substituted aryl group, respectively. Among these, more preferred are an alkylsulfinyl group and an arylsulfinyl group. Specific examples of the substituted sulfinyl group include a hexylsulfinyl group, a benzylsulfinyl group and a tolylsulfinyl group.

The substituted sulfonyl group ($R^{13}$—$SO_2$—) include those where $R^{13}$ is a monovalent nonmetallic atom group. More preferred examples thereof include an alkylsulfonyl group and an arylsulfonyl group. The alkyl group and the aryl group in these groups includes those described above for the alkyl group and the substituted alkyl group and those for the aryl group and the substituted aryl group, respectively. Specific examples of the substituted sulfonyl group include a butylsulfonyl group and a chlorophenylsulfonyl group.

The sulfonate group (—$SO_3$) means a conjugate base anion group of a sulfo group (—$SO_3H$) as described above and it is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The carboxylate group (—$CO_2$) means a conjugate base anion group of a carboxyl group (—$CO_2H$) as described above and it is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphono group means a compound resulting from substitution for one or two hydroxyl groups on the phosphono group by other organic oxo groups and preferred examples thereof include a dialkylphosphono group, a diarylphosphono group, an alkylarylphosphono group, a monoalkylphosphono group and a monoarylphosphono group. Among these, preferred are a dialkylphosphono group and a diarylphosphono group. Specific examples thereof include a diethylphosphono group, a dibutylphosphono group and a diphenylphosphono group.

The phosphonato group ($-PO_3^{2-}$, $-PO_3H^-$) means a conjugate base anion group derived from acid first dissociation or acid second dissociation of a phosphono group ($-PO_3H_2$). It is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonate group is a conjugate base anion group of the above-described substituted phosphono groups where one hydroxyl group is substituted by an organic oxo group. Specific examples thereof include a conjugate base of a monoalkylphosphono group ($-PO_3H$ (alkyl)) and a conjugate base of a monoarylphosphono group ($-PO_3H$(aryl)). The conjugate base is usually used preferably in combination with a counter cation. The counter cation includes commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The ring formed by combining $R^1$ and $R^2$ or $R^2$ and $R^3$ with each other is described below. The aliphatic ring formed by combining $R^1$ and $R^2$ or $R^2$ and $R^3$ with each other includes a 5-, 6-, 7- or 8-membered aliphatic ring, more preferably a 5- or 6-membered aliphatic ring. The aliphatic ring may further have a substituent on the carbon atoms constituting the ring (examples of the substituent include substituents described above for the substituted alkyl group) or a part of the ring-constituting carbons may be substituted by a hetero atom (e.g., oxygen atom, sulfur atom, nitrogen atom). Further, a part of the aliphatic ring may constitute a part of an aromatic ring.

The oxime ether compound is more preferably an α-substituted ketooxime ether compound represented by the following formula (II):

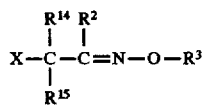

wherein $R^2$ and $R^3$, which may be the same or different, each represents a hydrocarbon group which may have a substituent and at the same time, may contain an unsaturated bond, or a heterocyclic group or $R^2$ and $R^3$ may be combined with each other to form a ring;

$R^{14}$ and $R^{15}$, which may be the same or different, each represents a hydrogen atom, a hydrocarbon group which may have a substituent and at the same time, may contain an unsaturated bond, a heterocyclic group, a hydroxyl group, a substituted oxy group, a mercapto group, a substituted thio group, an amino group or a substituted amino group or $R^{14}$ and $R^{15}$ may be combined with each other to form a ring and represent an alkylene group having from 2 to 8 carbon atoms which may contain

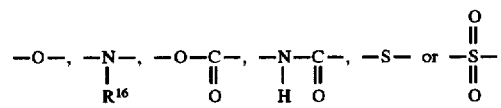

in the linking main chain of the ring;

$R^{16}$ represents a hydrogen atom, a hydrocarbon group which may have a substituent and at the same time, may contain an unsaturated bond, or a substituted carbonyl group; and X represents a hydrogen atom, a halogen atom, a hydrocarbon group which may have a substituent and at the same time, may contain an unsaturated bond, a hydroxyl group, a substituted oxy group, a mercapto group, a substituted thio group, an amino group, a substituted amino group, a substituted carbonyl group, a carboxylate group, a sulfo group, a sulfonate group, a substituted sulfinyl group, a substituted sulfonyl group, a phosphono group, a substituted phosphono group, a phosphonate group, a substituted phosphonate group, a cyano group or a nitro group.

The oxime ether compound is more preferably an α-aminoketooxime ether compound represented by formula (III):

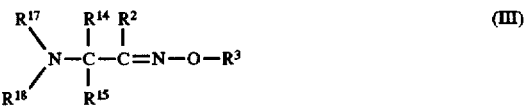

wherein $R^2$, $R^3$, $R^{14}$ and $R^{15}$ each has the same meaning as defined above;

$R^{17}$ and $R^{18}$ which may be the same or different, each represents a hydrogen atom or a hydrocarbon group which may have a substituent and at the same time, may contain an unsaturated bond or $R^{17}$ and $R^{18}$ may be combined with each other to form a ring and represent an alkylene group having from 2 to 8 carbon atoms which may contain

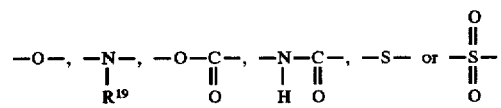

in the linking main chain of the ring;

$R^{19}$ represents a hydrogen atom, a hydrocarbon group which may have a substituent and may contain an unsaturated bond, or a substituted carbonyl group.

The above-described ketooxime ether compound is most preferably an α-aminoketooxime ether compound represented by the following formula (IV):

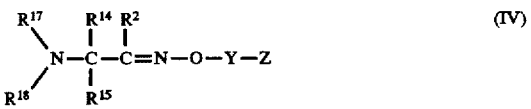

wherein $R^2$, $R^{14}$, $R^{15}$, $R^{17}$ and $R^{18}$ each has the same meaning as defined above;

Y represents a hydrocarbon linking group which may have a substituent and may contain an unsaturated bond (a divalent group resulting from eliminating one hydrogen of the hydrocarbon group);

Z represents an acid group having a pKa at the acid first dissociation of from 0 to 16, a precursor of the acid group, a conjugate base group of the acid group or a group resulting from substitution for a hydrogen atom dissociated from the acid group by a hydrocarbon group which may have a substituent (called a substituted acid group).

Particularly preferred examples of the acid group, the precursor thereof, the conjugate base group thereof and the substituted acid group include a hydroxyl group, a substituted oxy group, a mercapto group, a substituted carbonyl group, a carboxylate group, a sulfo group, a sulfonate group, a sulfamoyl group and a conjugate base group thereof, an N-alkylsulfamoyl group and a conjugate base group thereof, an N-arylsulfamoyl group and a conjugate base group thereof, an N-acylsulfamoyl group and a conjugate base group thereof, an N-alkylsulfonylsulfamoyl group and a conjugate base group thereof, an N-arylsulfonylsulfamoyl group and a conjugate base group thereof, an N-alkylsulfonylcarbamoyl group and a conjugate base group thereof, an N-arylsulfonylcarbamoyl group and a conjugate base group thereof, a phosphono group, a substituted phosphono group, a phosphonate group, a substituted phosphonate group, a cyano group, an alkoxysilyl group, an aryloxysilyl group, and a hydroxysilyl group and a conjugate base group thereof, which groups are described above.

Examples of the compound are set froth below, but the present invention is by no means limited thereto.

Specific examples of the ketooxime ether compound represented by formula (II) include:

Compound

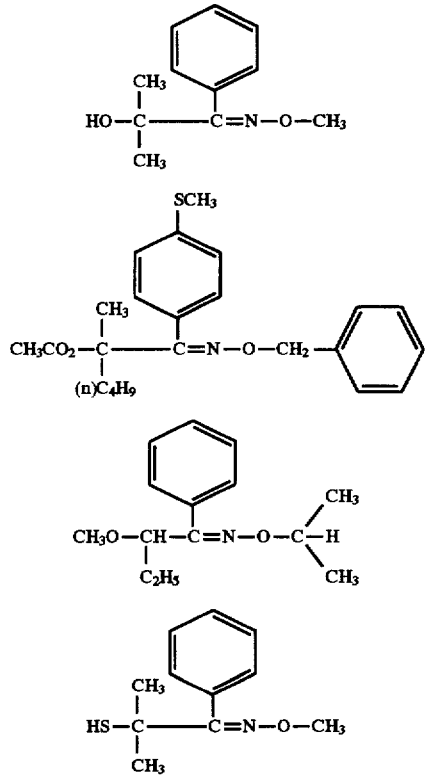

-continued
Compound

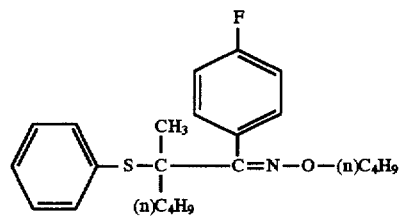
II-5

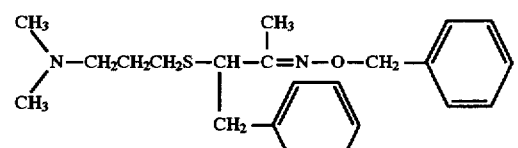
II-6

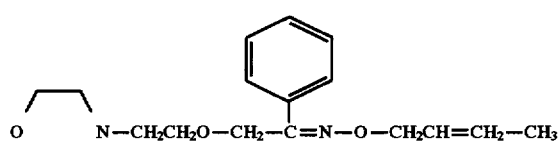
II-7

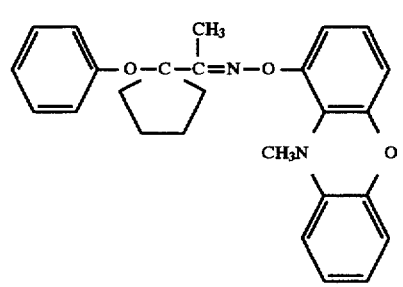
II-8

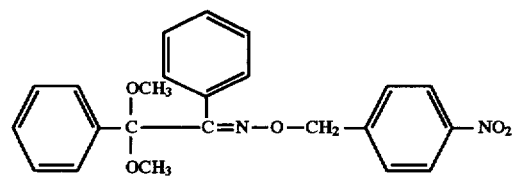
II-9

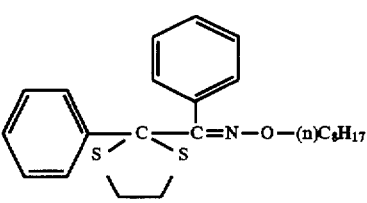
II-10

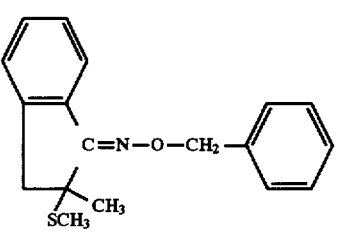
II-11

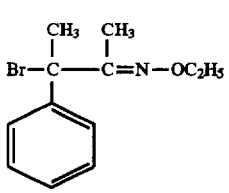
II-12 and compounds represented by formula (III).

Preferred specific examples of the α-aminoketooxime ether compound represented by formula (III) include:

| Compound | |
|---|---|
| III-1 | (structure) |
| III-2 | (structure) |
| III-3 | (structure) |
| III-4 | (structure) |
| III-5 | (structure) |
| III-6 | (structure) |
| III-7 | (structure) |
| III-8 | (structure) |
| III-9 | (structure) |
| III-10 | (structure) |
| III-11 | (structure) |
| III-12 | (structure) |

| Compound | Compound |
|---|---|
| III-13 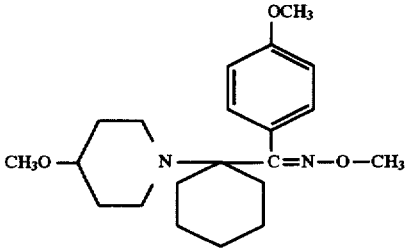 | III-19 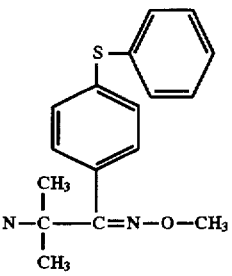 |
| III-14 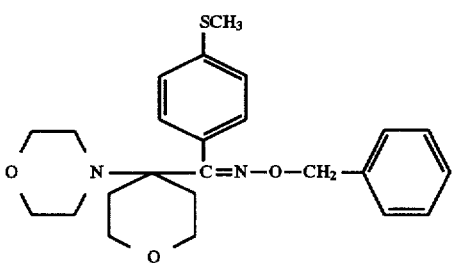 | III-20 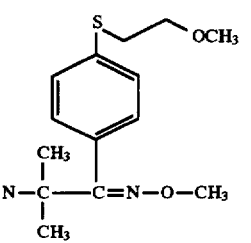 |
| III-15 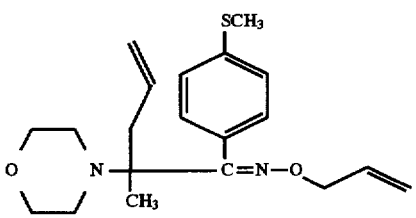 | III-21 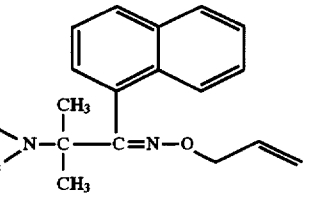 |
| III-16 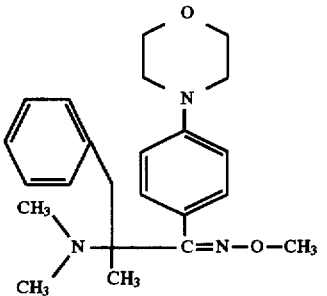 | III-22 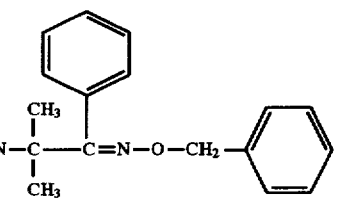 |
| III-17 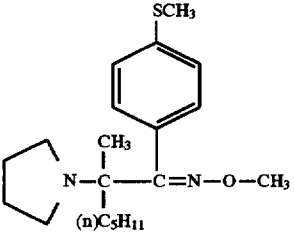 | III-23 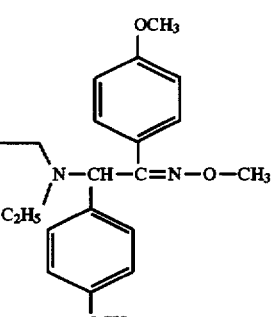 |
| III-18 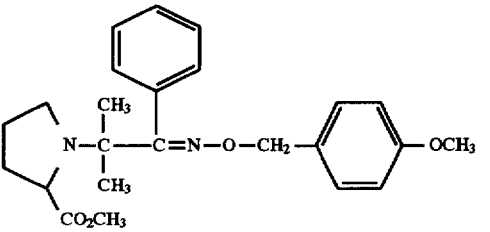 | III-24 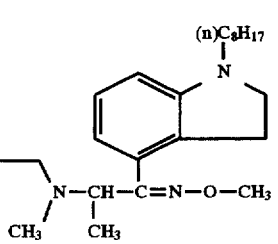 |

| Compound |
|---|
| III-25 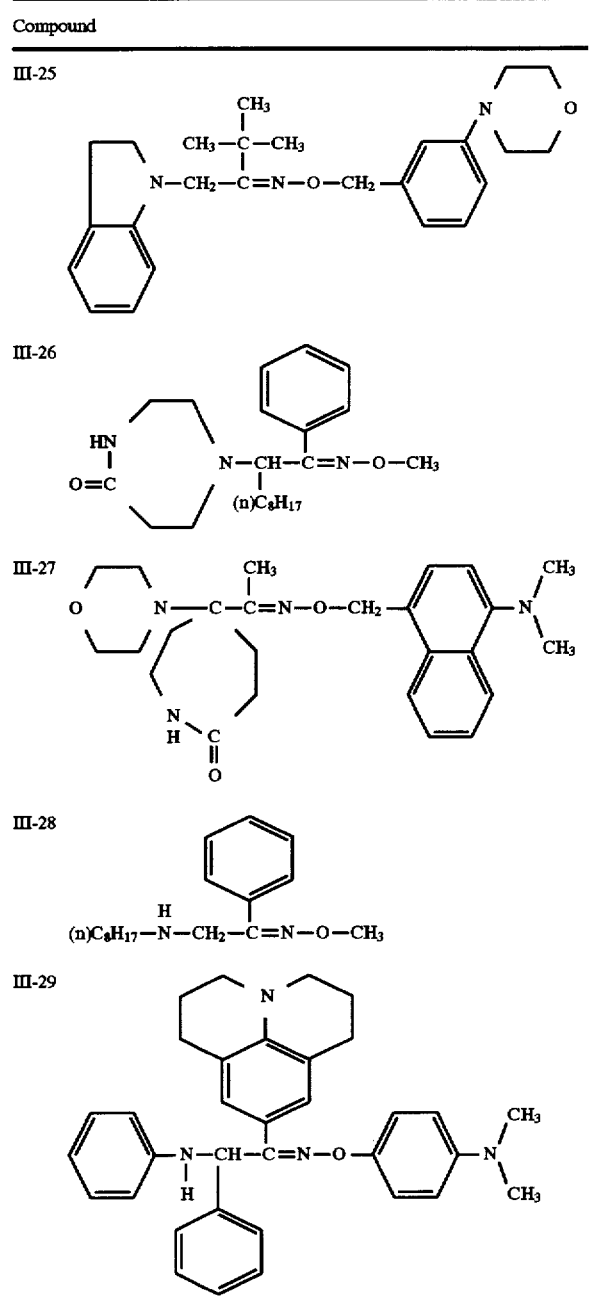 |
| III-26 |
| III-27 |
| III-28 |
| III-29 |
| Compound |
|---|
| III-30 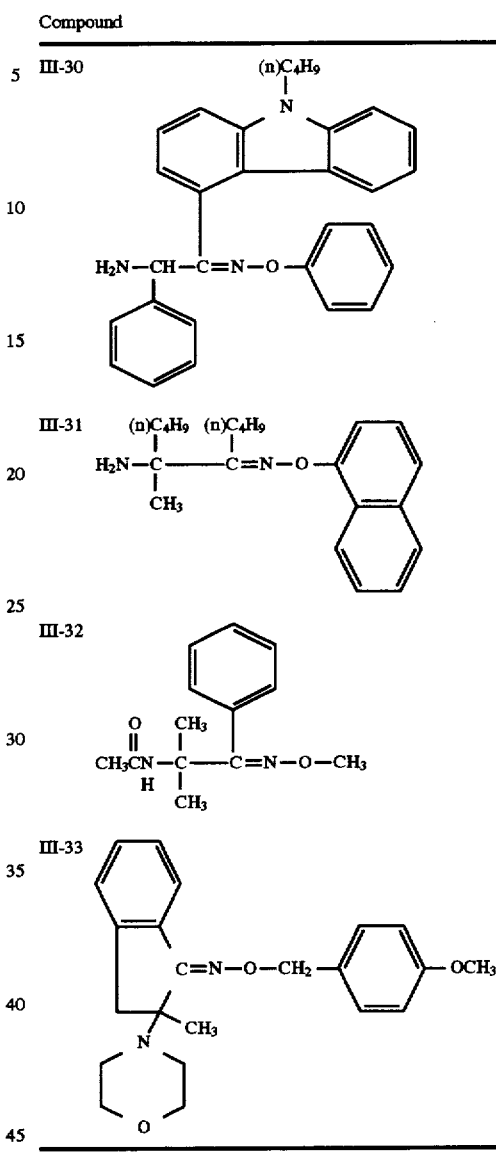 |
| III-31 |
| III-32 |
| III-33 |
and compounds represented by formula (IV).
Preferred specific examples of the α-aminoketooxime ether compound represented by formula (IV) include:
| Compound |
|---|
| IV-1 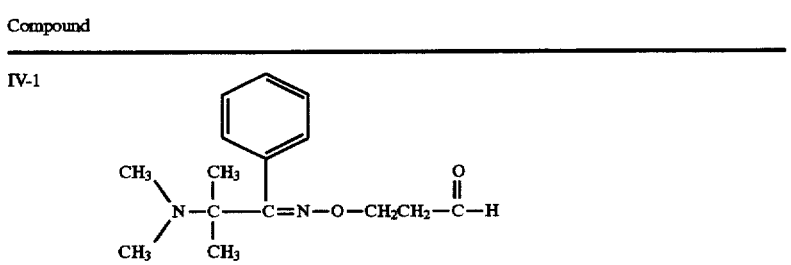 |

-continued
| Compound | |
|---|---|
| IV-2 | 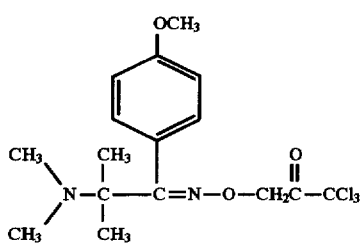 |
| IV-3 | 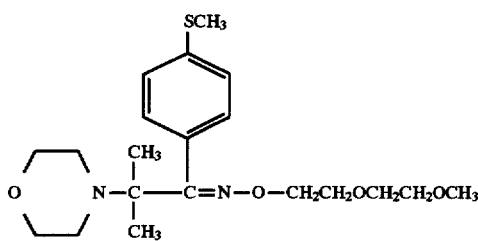 |
| IV-4 | 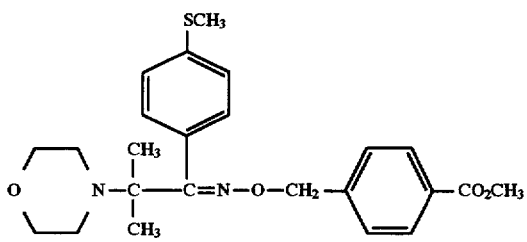 |
| IV-5 | 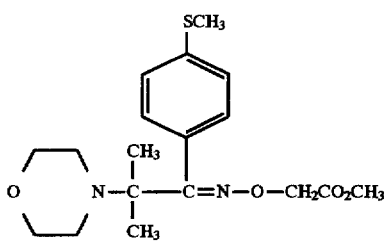 |
| IV-6 | 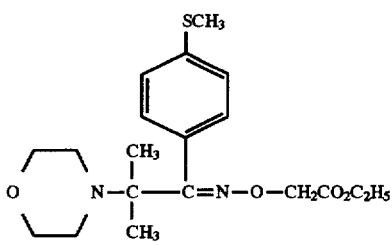 |
| IV-7 | 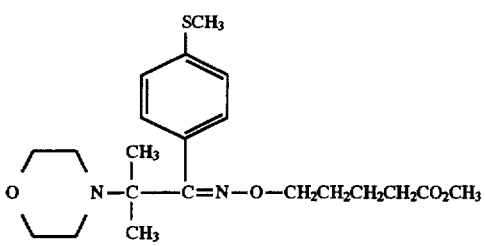 |

-continued
Compound
IV-8
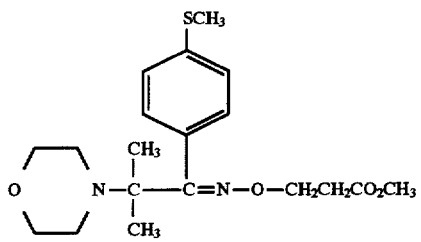
IV-9
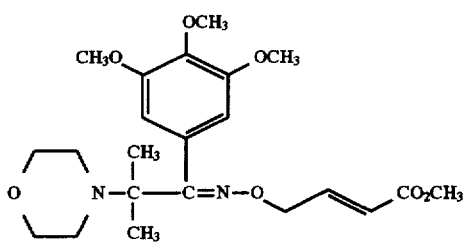
IV-10
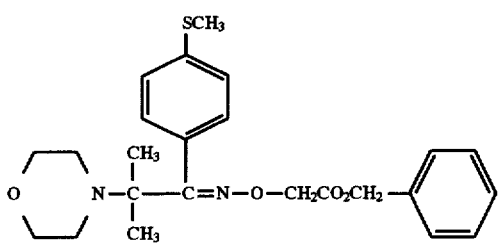
IV-11
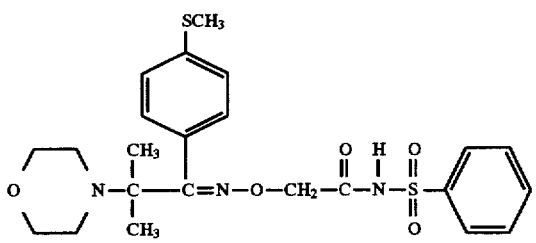
IV-12
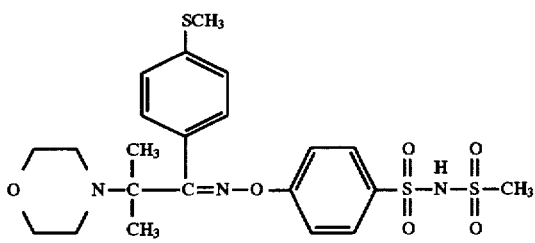
IV-13
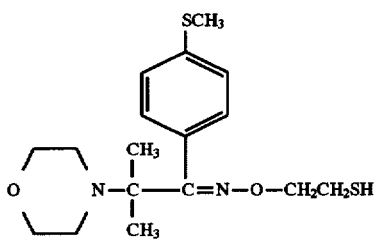

-continued
| Compound | |
|---|---|
| IV-14 | 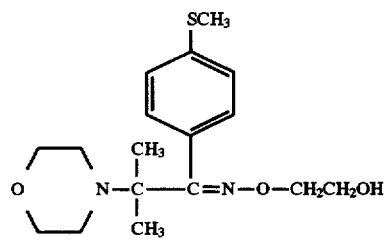 |
| IV-15 | 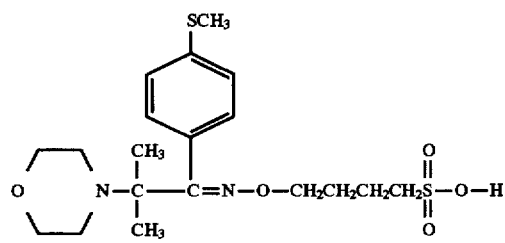 |
| IV-16 | 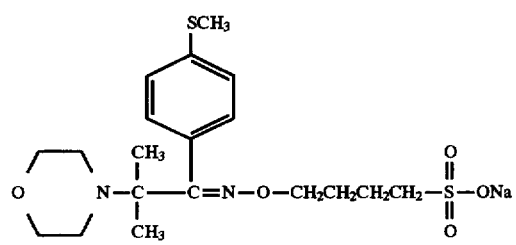 |
| IV-17 | 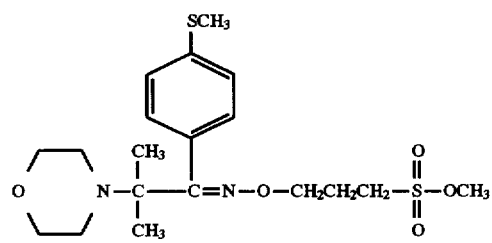 |
| IV-18 | 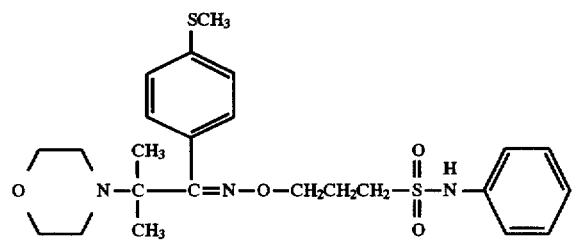 |
| IV-19 | 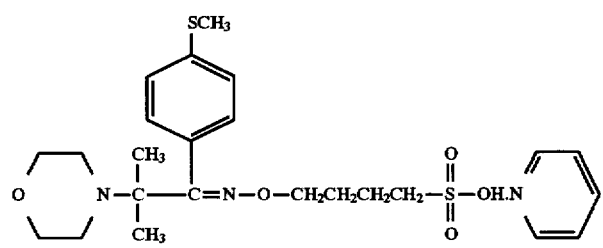 |

-continued
| Compound |
|---|
| IV-20 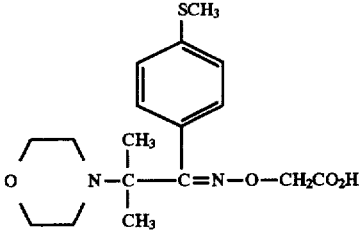 |
| IV-21 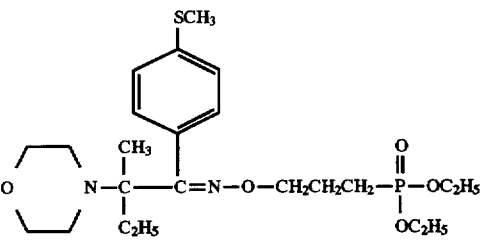 |
| IV-22 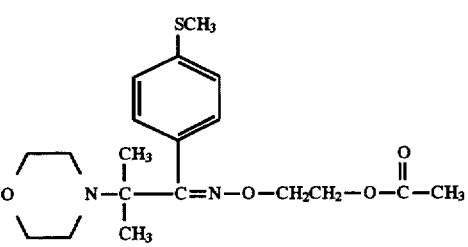 |
| IV-23 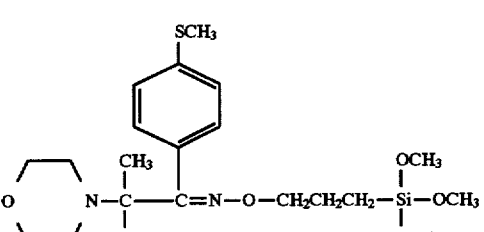 |
| IV-24 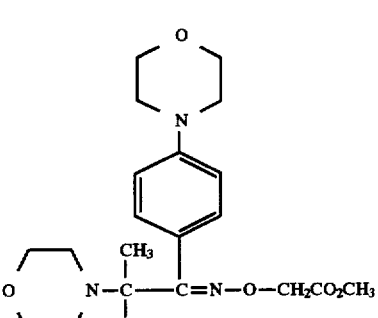 |
| IV-25 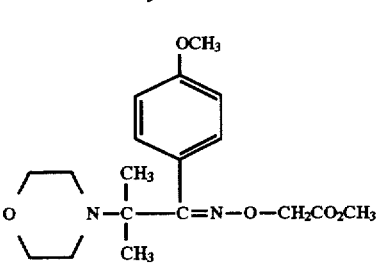 |

| Compound | |
|---|---|
| IV-26 | 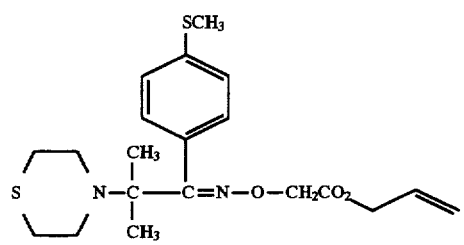 |
| IV-27 | 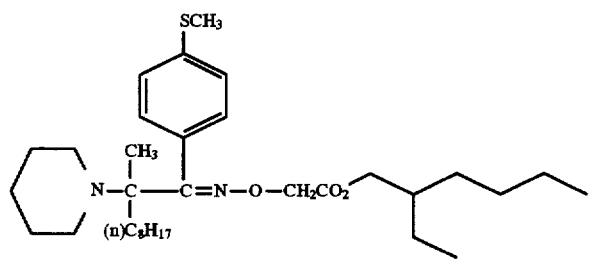 |
| IV-28 | 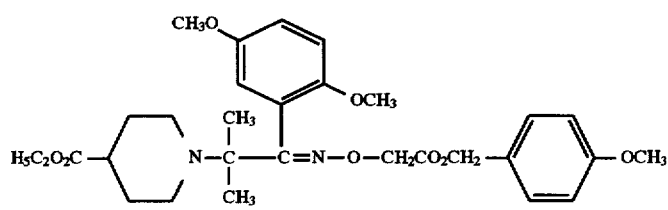 |
| IV-29 | 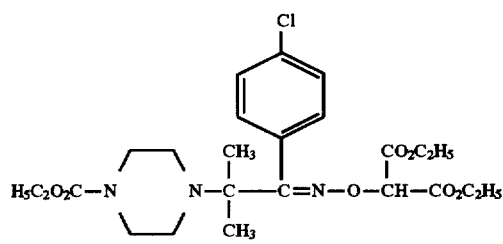 |
| IV-30 | 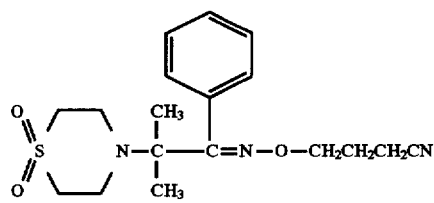 |
| IV-31 | 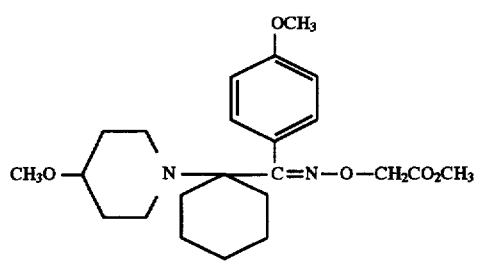 |

-continued
Compound
IV-32
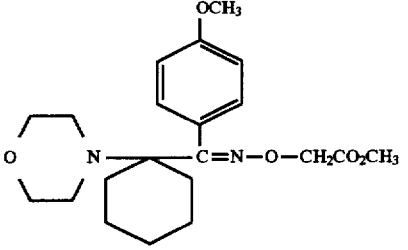
IV-33
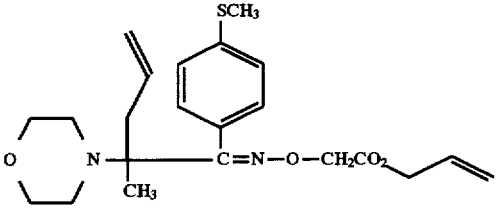
IV-34
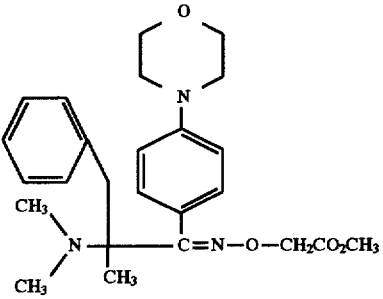
IV-35
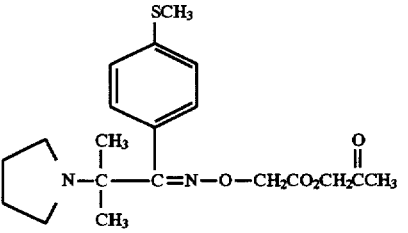
IV-36
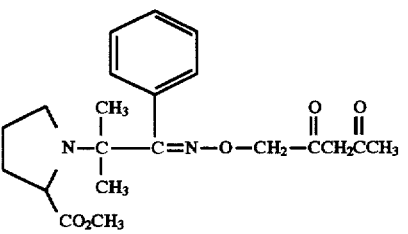
IV-37
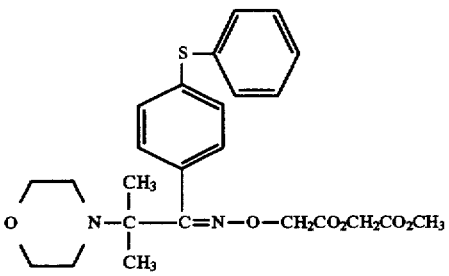

-continued
Compound
IV-38
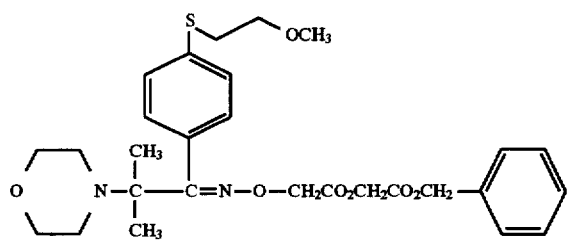
IV-39
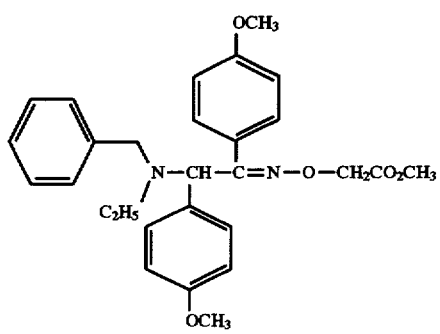
IV-40
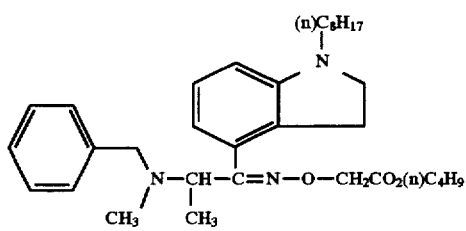
IV-41
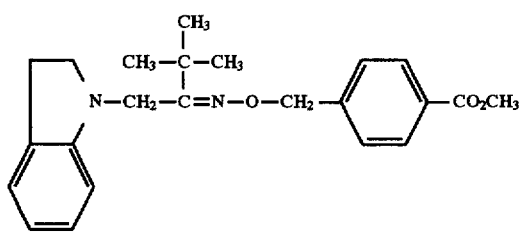
IV-42
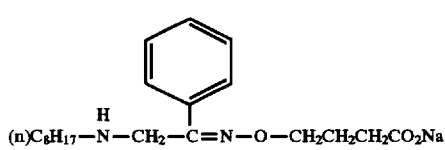
IV-43
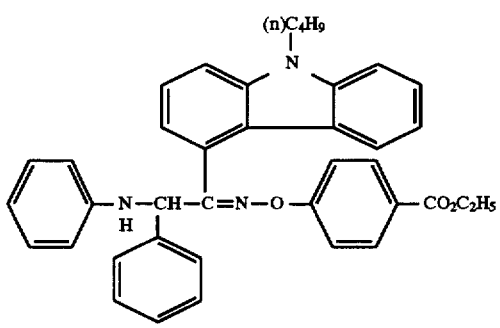

-continued
| Compound | |
|---|---|
| IV-44 | 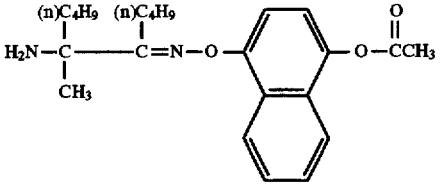 |
| IV-45 | 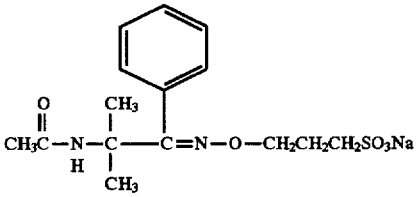 |
| IV-46 | 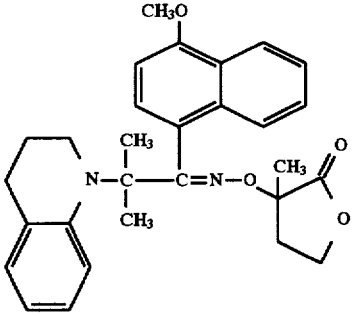 |
| IV-47 | 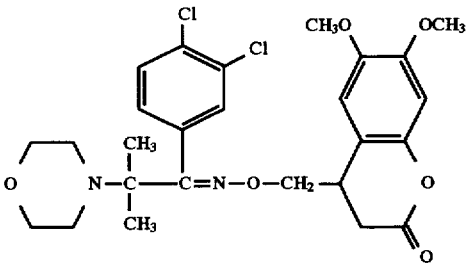 |
| IV-48 | 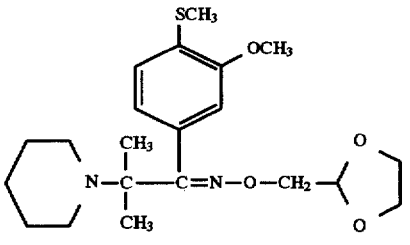 |
| IV-49 | 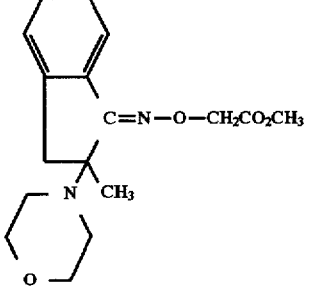 |

The above-described oxime ether compounds represented by formula (I) or formulae (II), (III) and (IV) for use in the photopolymerizable composition of the present invention may be used individually or in combination of two or more.

The compound represented by formula (I), (II), (III) or (IV) is used in-an amount, based on all components of the photopolymerizable composition, of usually from 0.05 to 50%, preferably from 0.5 to 35%, more preferably from 1 to 25%. If the amount exceeds 50%, a film formation failure (crack) is caused, whereas if it is less than 0.05%, bad curing results, thus these are not preferred.

Further, it is preferred to let an already known photopolymerization initiator as component (iii) be present together in the photosensitive composition of the present invention. Preferred examples of the photopolymerization initiator include (a) aromatic ketones, (b) aromatic onium salt compounds, (c) organic peroxides, (d) thio compounds, (e) hexaarylbiimidazole compounds, (f) ketooxime ester compounds, (g) borate compounds, (h) azinium compounds, (i) metallocene compounds, (j) active ester compounds and (k) compounds having a carbon halogen bond.

Preferred examples of the aromatic ketone (a) as one example of component (iii) include compounds having a benzophenone skeleton or a thioxanthone skeleton described in J. P. Fouassier and J. F. Rabek, *Radiation Curing in Polymer Science and Technology*, pp. 77–117 (1993) and specific examples thereof are set forth below.

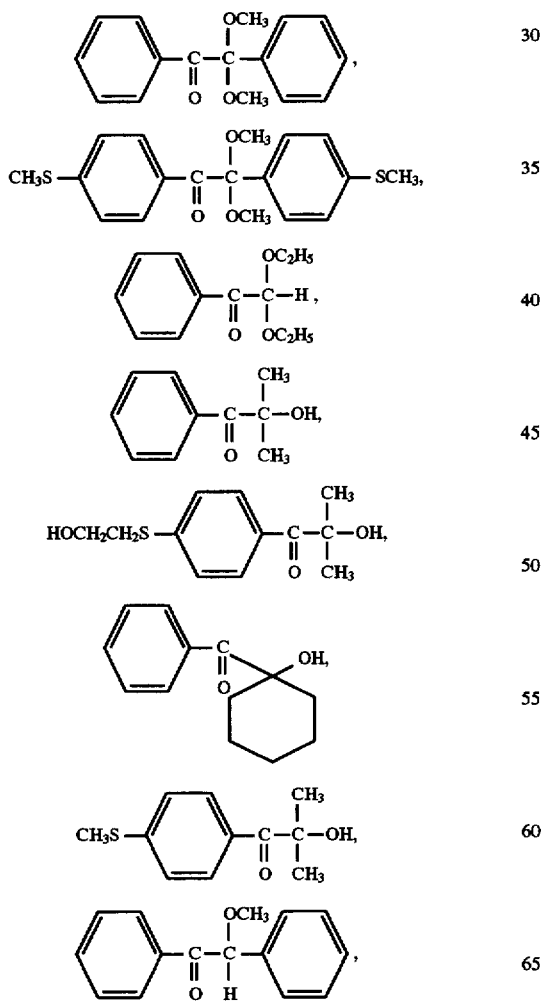
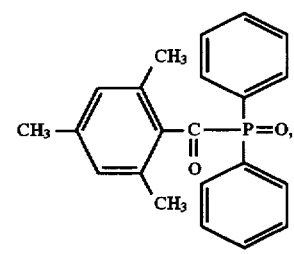
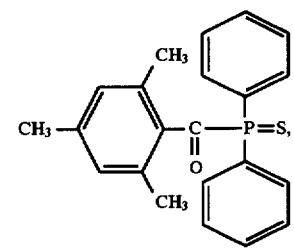
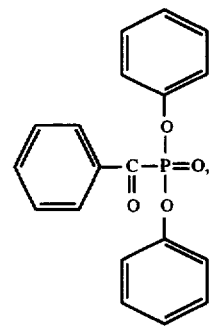
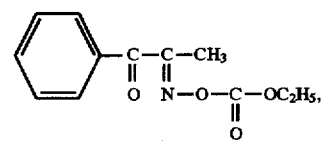
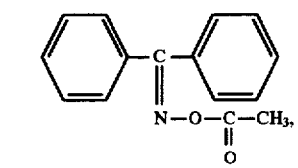
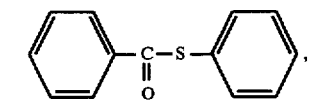
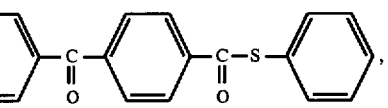
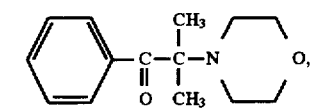
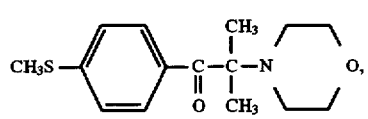

-continued

More preferred examples of the aromatic ketone (a) include α-thiobenzophenone compounds described in JP-B-47-6416, benzoin ethers described in JP-B-47-3981 such as

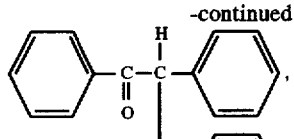
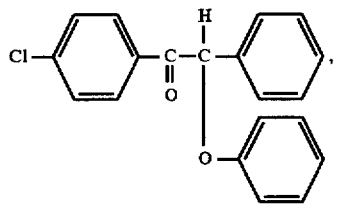
α-substituted benzoin compounds described in JP-B-47-22326 such as
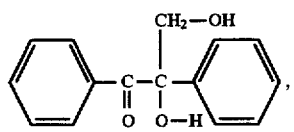
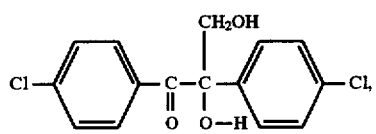
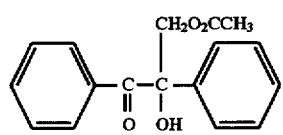
benzoin derivatives described in JP-B-47-23664, aroylphosphonates described in JP-A-57-30704, dialkoxybenzophenones described in JP-B-60-26483 such as
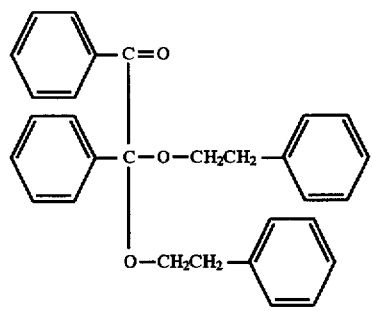
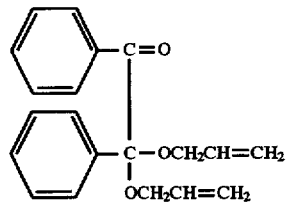
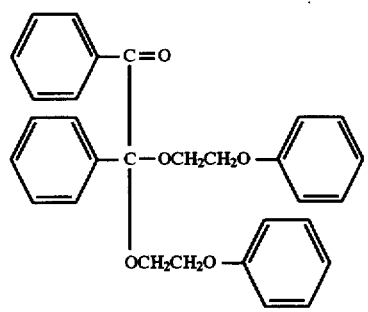
a benzoin ether described in JP-B-60-26403 and JP-A-62-81345 such as
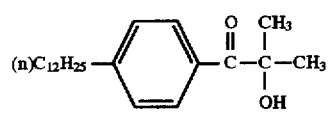
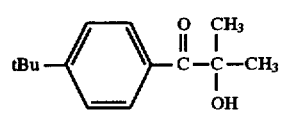
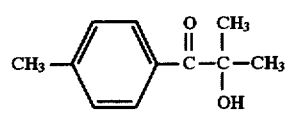
α-aminobenzophenones described in JP-B-1-34242, U.S. Pat. No. 4,318,791 and European Patent 0284561A1 such as
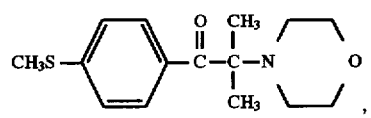
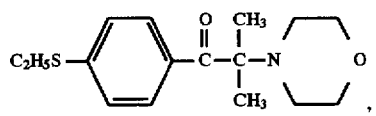

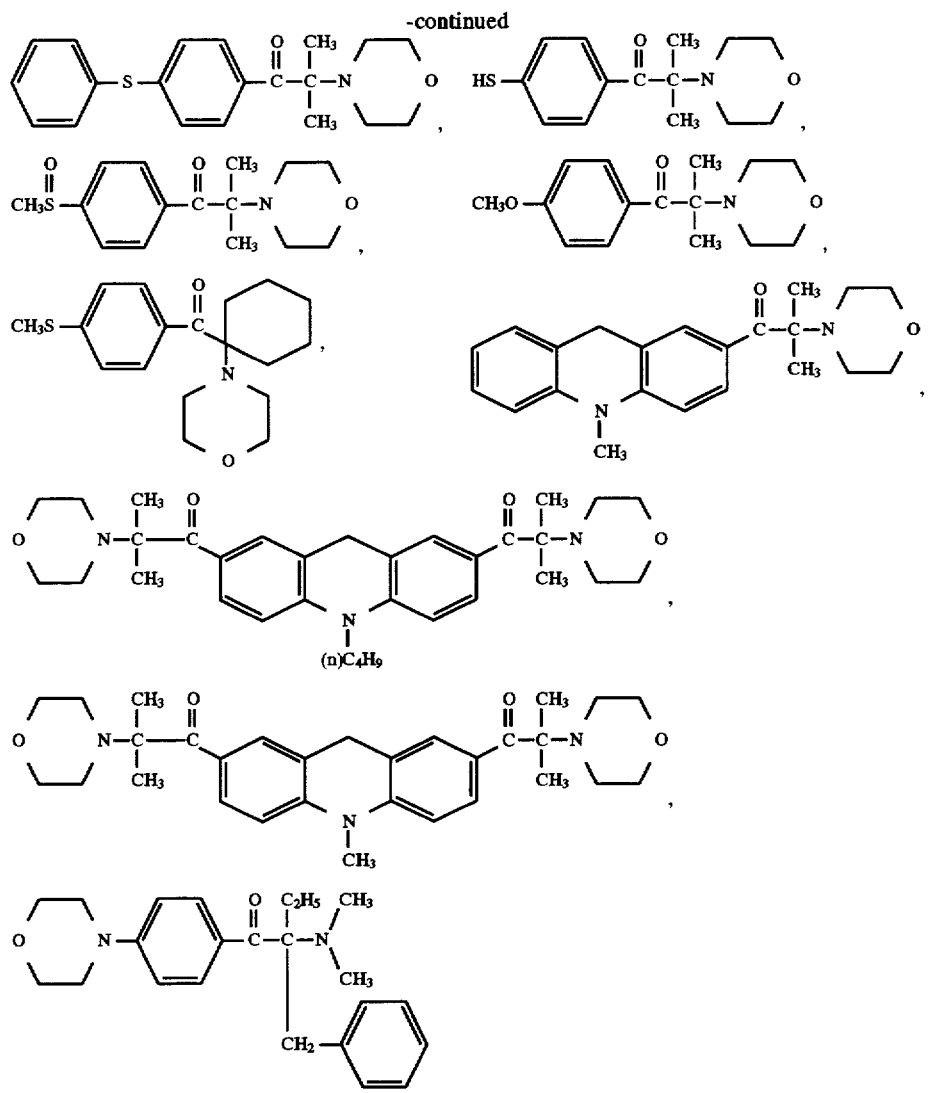
p-di(dimethylaminobenzoyl)benzenes described in JP-A-2-211452 such as
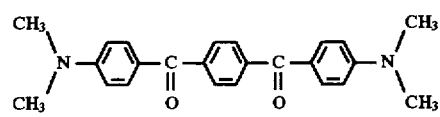
thio-substituted aromatic ketones described in JP-A-61-194062 such as
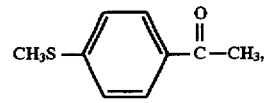
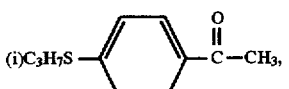
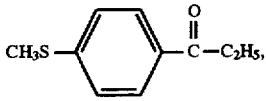
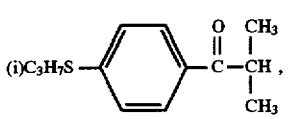

acylphosphine sulfides described in JP-B-2-9597 such as

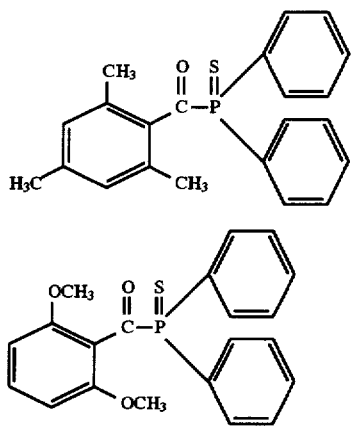

acylphosphines described in JP-B-2-9596 such as

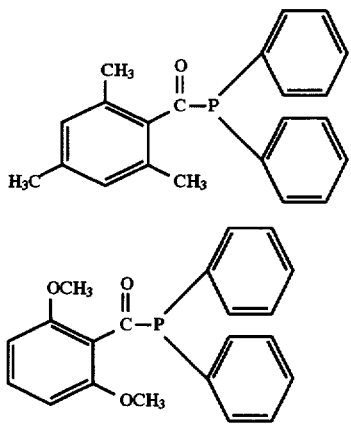

thioxanthones described in JP-B-63-61950 and coumarins described in JP-B-59-42864.

The aromatic onium salt (b) as another example of component (iii) includes an aromatic onium salt of elements belonging to Groups V, VI and VII of the Periodic Table, more specifically, an aromatic onium salt of N, P, As, Sb, Bi, O, S, Se, Te and I. Examples of the aromatic onium salt include the compounds described in JP-B-52-14277, JP-B-52-14278 and JP-B-52-14279. Specific examples thereof include the following compounds.

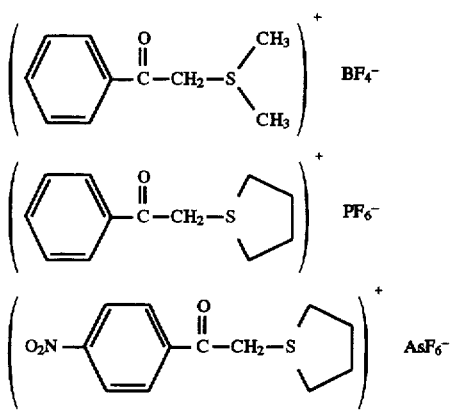

-continued

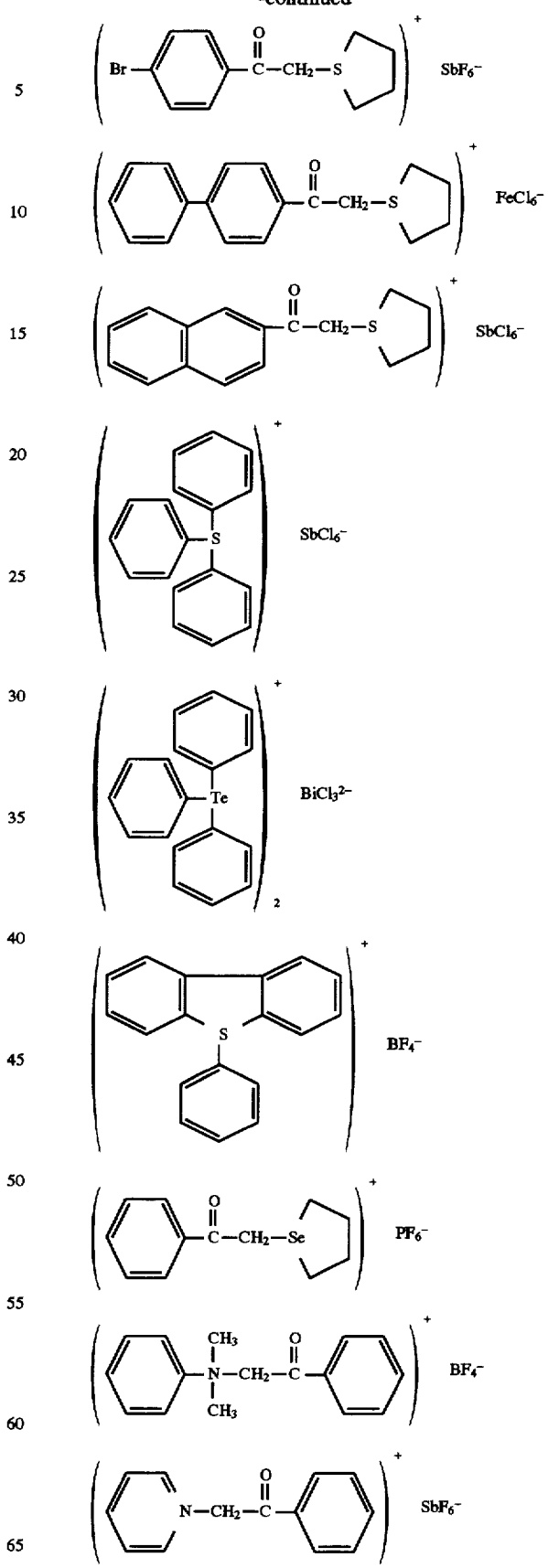

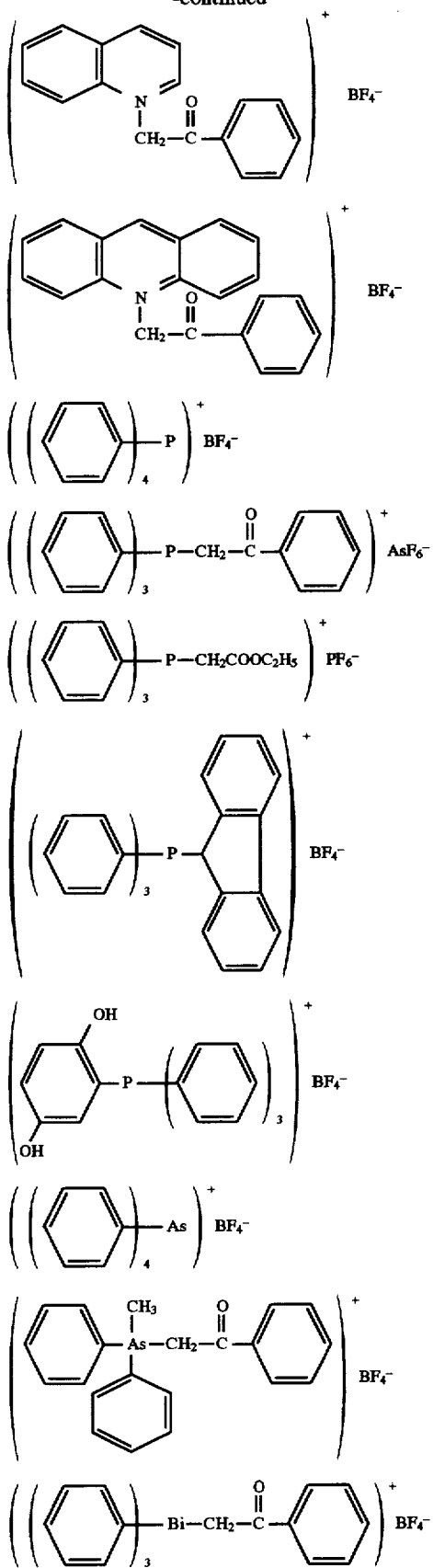

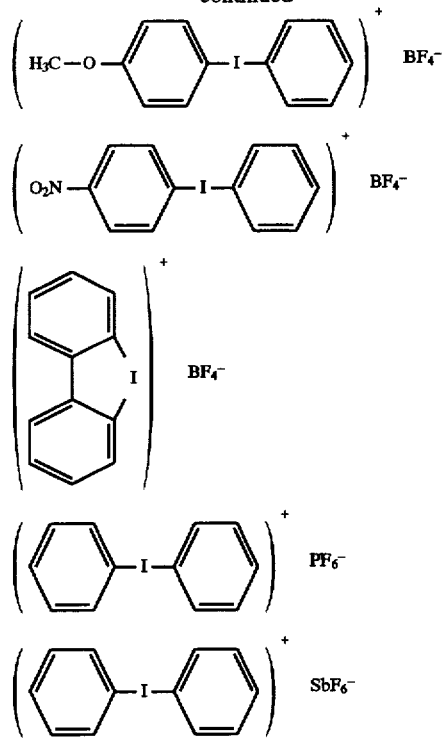

The organic peroxide (c) as still another example of component (iii) for use in the present invention includes almost all organic compounds having one or more oxygen-oxygen bonds in the molecule and examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl) benzene, 2,5-dimethyl-2,5-di(tert-butylperoxy)hexane, 2,5-oxanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tertiary carbonate, 3,3',4,4'-tetra-(t-butylperoxycarbonyl)benzophenone, 3,3',4,4'-tetra-(t-amylperoxycarbonyl)benzophenone, 3,3',4,4'-tetra-(t-hexylperoxycarbonyl)benzophenone, 3,3',4,4'-tetra(t-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyldi(t-butylperoxy dihydrogen diphthalate) and carbonyldi(t-hexylperoxy dihydrogen diphthalate).

Among these, preferred are ester peroxides such as 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t- octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-t-butyl diperoxyisophthalate.

The thio compound (d) as an example of component (iii) for use in the present invention is represented by formula (V):

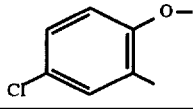

(wherein $R^{20}$ represents an alkyl group, an aryl group or a substituted aryl group and $R^{21}$ represents a hydrogen atom or an alkyl group or $R^{20}$ and $R^{21}$ may be combined with each other to represent a nonmetallic atom group necessary for forming a 5-, 6- or 7-membered ring which may contain a hereto atom selected from an oxygen atom, a sulfur atom and a nitrogen atom).

The alkyl group represented by $R^{20}$ in formula (II) is preferably an alkyl group having from 1 to 4 carbon atoms. The aryl group represented by $R^{21}$ is preferably an aryl group having from 6 to 10 carbon atoms such as phenyl and naphthyl and the substituted aryl group includes the above-described aryl group substituted by a halogen atom such as chlorine, an alkyl group such as methyl or an alkoxy group such as methoxy and ethoxy.

$R^{21}$ is preferably an alkyl group having from 1 to 4 carbon atoms.

Specific examples of the thio compound represented by formula (V) include the following compounds.

| No. | $R^{20}$ | $R^{21}$ |
|---|---|---|
| 1 | H | H |
| 2 | H | CH₃ |
| 3 | CH₃ | H |
| 4 | CH₃ | CH₃ |
| 5 | C₆H₅ | C₂H₅ |
| 6 | C₆H₅ | C₄H₉ |
| 7 | C₆H₄Cl | CH₃ |
| 8 | C₆H₄Cl | C₄H₉ |
| 9 | C₆H₄—CH₃ | C₄H₉ |
| 10 | C₆H₄—OCH₃ | CH₃ |
| 11 | C₆H₄—OCH₃ | C₂H₅ |
| 12 | C₆H₄OC₂H₅ | CH₃ |
| 13 | C₆H₄OC₂H₅ | C₂H₅ |
| 14 | C₆H₄OCH₃ | C₄H₉ |
| 15 | ⁺(CH₂)₇⁻ | |
| 16 | ⁺(CH₂)₂S— | |
| 17 | —CH(CH₃)—CH₂—S— | |
| 18 | —CH₂—CH(CH₃)—S— | |
| 19 | —C(CH₃)₂—CH₂—S— | |
| 20 | —CH₂—C(CH₃)₂—S— | |
| 21 | —(CH₂)₂—O— | |
| 22 | —CH(CH₃)—CH₂—O— | |
| 23 | —C(CH₃)₂—CH₂—O— | |
| 24 | —CH═CH—N(CH₃)— | |
| 25 | —(CH₂)₃S— | |
| 26 | —(CH₂)₂CH(CH₃)─S— | |
| 27 | —(CH₂)₃O— | |
| 28 | —(CH₂)₅— | |
| 29 | —C₆C₄—O— | |
| 30 | —N═C(SCH₃)—S— | |
| 31 | —C₆H₄—NH— | |
| 32 |  | |

The hexaarylbiimidazole (e) as another example of component (iii) for use in the present invention includes lophine dimers described in JP-B-45-37377 and JP-B-44-86516 such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis (o-trifluorophenyl)-4,4',5,5'-tetraphenylbiimidazole.

The ketooxime ester (f) as another example of component (iii) for use in the present invention includes 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

The borate salt (g) as still another example of component (iii) of the present invention includes the compound represented by formula (VI):

$$R^{22}-\underset{\underset{R^{24}}{|}}{\overset{\overset{R^{23}}{|}}{B}}-R^{25} \quad Z^+ \quad \text{(VI)}$$

(wherein $R^{22}$, $R^{23}$, $R^{24}$ and $R^{25}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, two or more groups of $R^{22}$, $R^{23}$, $R^{24}$ and $R^{25}$ may be combined to form a cyclic structure, provided that at least one of $R^{22}$, $R^{23}$, $R^{24}$ and $R^{25}$ is a substituted or unsubstituted alkyl group, and $Z^+$ represents an alkali metal cation or a quaternary ammonium cation).

The alkyl group represented by $R^{22}$, $R^{23}$, $R^{24}$ or $R^{25}$ includes linear, branched and cyclic alkyl groups each preferably having from 1 to 18 carbon atoms. Specific examples thereof include methyl, ethyl, propyl, isopropyl, butyl, pentyl, hexyl, octyl, stearyl, cyclobutyl, cyclopentyl and cyclohexyl. The substituted alkyl group includes the above-described alkyl group substituted by a substituent such as halogen atom (e.g., —Cl, —Br), a cyano group, a nitro group, an aryl group (preferably a phenyl group), a hydroxy group,

(wherein $R^{26}$ and $R^{27}$ each independently represents a hydrogen atom, an alkyl group having from 1 to 14 carbon atoms or an aryl group), —COOR²⁸ (wherein $R^{28}$ represents a hydrogen atom, an alkyl group having from 1 to 14 carbon atoms or an aryl group), —OCOR²⁹ or —OR³⁰ (wherein R²⁹ and R³⁰ each represents an alkyl group having from 1 to 14 carbon atoms or an aryl group).

The aryl group represented by $R^{22}$, $R^{23}$, $R^{24}$ or $R^{25}$ includes mono-, di- and tricyclic aryl groups such as a phenyl group and a naphthyl group and the substituted aryl group includes the above-described aryl group substituted by a substituent described above for the substituted alkyl group or by an alkyl group having from 1 to 14 carbon atoms.

The alkenyl group represented by $R^{22}$, $R^{23}$, $R^{24}$ or $R^{25}$ includes linear, branched and cyclic alkenyl groups each having from 2 to 18 carbon atoms and the substituent for the substituted alkenyl group includes the substituents described above for the substituted alkyl group.

The alkynyl group represented by $R^{22}$, $R^{23}$, $R^{24}$ or $R^{25}$ includes linear and branched alkynyl group each having from 2 to 28 carbon atoms and the substituent of the substituted alkynyl group includes the substituents described above for the substituted alkyl group.

The heterocyclic group represented by $R^{22}$, $R^{23}$, $R^{24}$ or $R^{25}$ includes 5- and greater membered, preferably 5- to 7-membered heterocyclic groups each containing at least one of N, S and O and the heterocyclic group may contain a condensed ring and further may have a substituent described above for the substituted aryl group.

Specific examples of the compound represented by formula (IV) include the compounds described in U.S. Pat. Nos. 3,567,453 and 4,343,891 and European Patent Nos. 109,772 and 109,773 and the compounds described below.

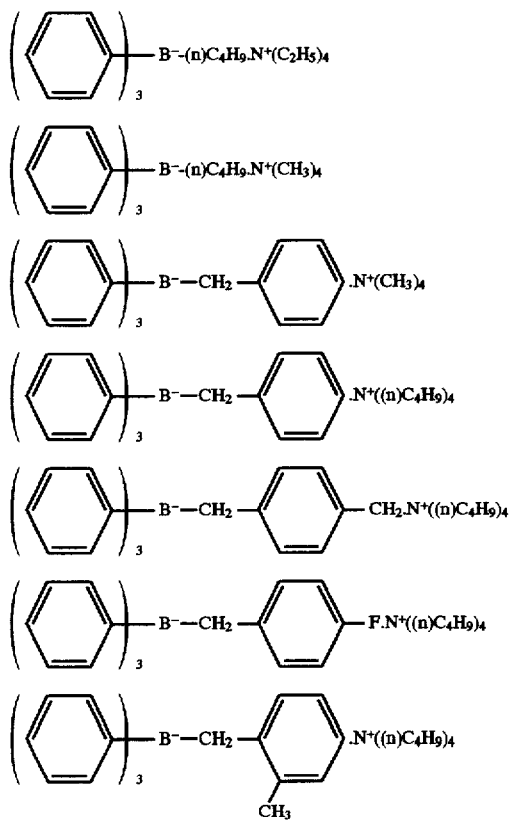

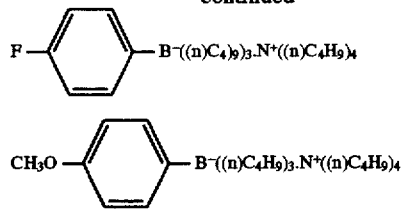

Examples of the azinium salt compound (h) as another example of component (iii) of the present invention include the compounds having an N—O bond described in JP-A-63-138345, JP-A-63-142345, JP-A-63-142346, JP-A-63-143537 and JP-B-46-42363.

Examples of the metallocene compound (i) as still another example of component (iii) include titanocene compounds described in JP-A-59-152396, JP-A-61-151197, JP-A-63-41484, JP-A-2-249 and JP-A-2-4705 and iron-allene complexes described in JP-A-1-304453 and JP-A-1-152109.

Examples of the active ester compound (j) as still another example of component (iii) include imidosulfonate compounds described in JP-B-62-6223 and active sulfonates described in JP-B-63-14340 and JP-A-59-174831.

Preferred examples of compound (k) having a carbon halogen bond as one example of component (iii) include those represented by the following formulae (VII) to (XIII).

A compound represented by formula (VII):

(wherein $X^2$ represents a halogen atom, $Y^2$ represents —$CX^2$, —$NH_2$, —$NHR^{32}$—$NR^{32}$ or —$OR^{32}$ (wherein $R^{32}$ represents an alkyl group, a substituted alkyl group, an aryl group or a substituted aryl group) and $R^{31}$ represents —$CX^2$, an alkyl group, a substituted alkyl group, an aryl group, a substituted aryl group or a substituted alkenyl group);

A compound represented by formula (VIII):

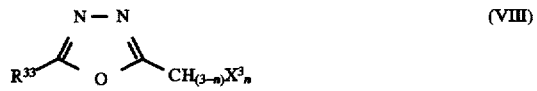

(wherein $R^{33}$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group, $X^2$ represents a halogen atom and n represents an integer of from 1 to 3);

A compound represented by formula (IX):

$$R^{34}—Z^2—CH_{(2-m)}X_m{}^3R^{35} \quad (IX)$$

(wherein $R^{34}$ represents an aryl group or a substituted aryl group and $R^{35}$ represents

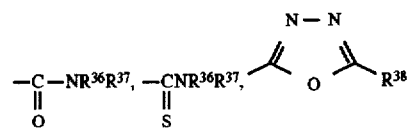

or a halogen atom, $Z^2$ represents —C(=O)—, —C(=S)— or —SO₂—, $R^{36}$ and $R^{37}$ each represents an alkyl group, a substituted alkyl group, an alkenyl group, a substituted alkenyl group, an aryl group or a substituted aryl group, $R^{38}$ has the same meaning as $R^{32}$ in formula (VII), $X^3$ represents a halogen atom and m represents 1 or 2);

A compound represented by formula (X):

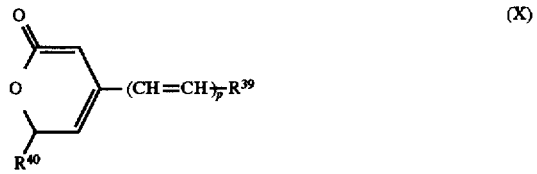

(wherein $R^{39}$ represents an aryl group which may be substituted or a heterocyclic group which may be substituted, $R^{40}$ represents a trihaloalkyl or trihaloalkenyl group having from 1 to 3 carbon atoms and p represents 1, 2 or 3);

A carbonylmethylene heterocyclic compound having a trihalogenomethyl group represented by formula (XI):

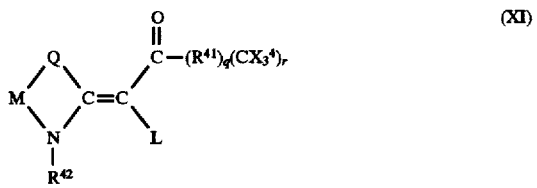

(wherein L represents a hydrogen atom or a substituent represented by formula: $CO-(R^{41})_q(CX_3^4)_r$, Q represents a sulfur atom, a selenium atom, an oxygen atom, a dialkylmethylene group, an alken-1,2-ylene group, 1,2-phenylene group or an N-R group, M represents a substituted or unsubstituted alkylene or alkenylene group or a 1,2-arylene group, $R^{42}$ represents an alkyl group, an aralkyl group or an alkoxyalkyl group, $R^{41}$ represents a carbocyclic or heterocyclic divalent aromatic group, $X^4$ represents a chlorine atom, a bromine atom or an iodine atom and q=0 and r=1 or q=1 and r=1 or 2);

A 4-halogeno-5-(halogenomethylphenyl)oxazole derivative represented by formula (XII):

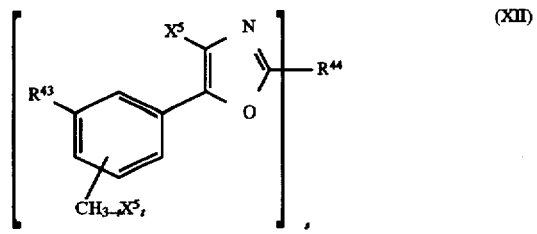

(wherein $X^5$ represents a halogen atom, t represents an integer of from 1 to 3, s represents an integer of from 1 to 4, $R^{43}$ represents a hydrogen atom or a $CH_{3-t}X^5_t$ group and $R^{44}$ represents an s-valent unsaturated organic group which may be substituted); and A 2-(halogenomethylphenyl)-4-halogenooxazole derivative represented by formula (XIII):

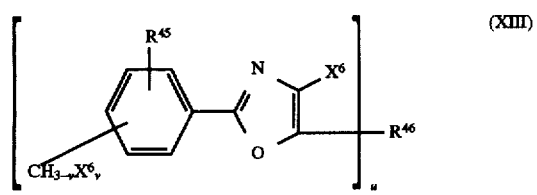

(wherein $X^6$ represents a halogen atom, v represents an integer of from 1 to 3, u represents an integer of from 1 to 4, $R^{45}$ represents a hydrogen atom or a $CH_{3-v}X^6_v$ group and $R^{46}$ represents a u-valent unsaturated organic group which may be substituted).

Specific examples of the compound having a carbon-halogen bond include:

Compounds described, for example, in Wakabayashi et al, Bull. Chem. Soc. Japan, 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine;

Compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine;

Compounds described in JP-A-53-133428 such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl)naphtho-1-yl]-4,6-bis-trichloromethyl-S-triazine, 2-(4,7-dimethoxynaphtho-1-yl)-4,6-bis-trichloromethyl-S-triazine and 2-(acenaphtho-5-yl)-4,6-bis-trichloro-methyl-S-triazine;

Compounds described in German Patent No. 3,337,024:

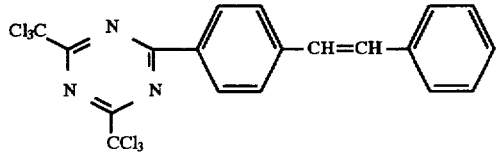

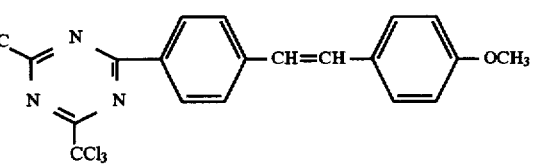

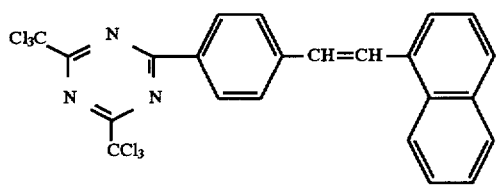

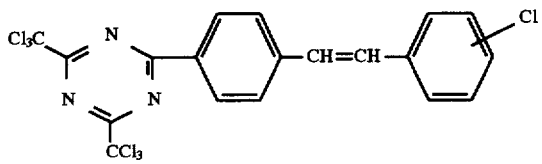

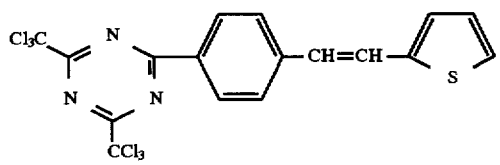

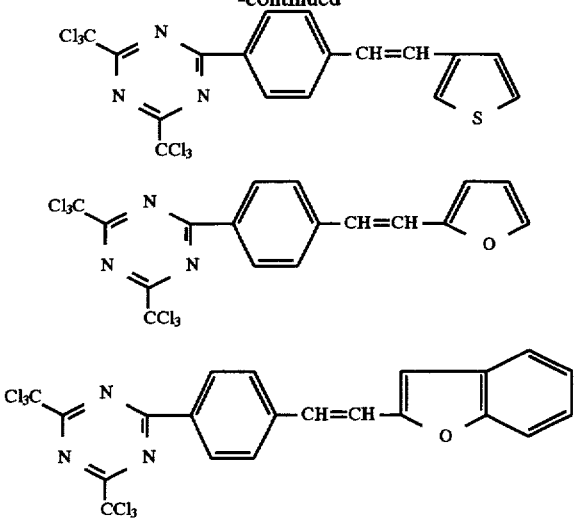

Compounds described in F. C. Schaefer et al., *J. Org. Chem.*, 29, 1527 (1964) such as 2-methyl-4,6-bis(tribromomethyl)-S-triazine, 2,4,6-tris(tribromomethyl)-S-triazine, 2,4,6-tris(tribromomethyl)-S-triazine, 2-amino-4-methyl-6-tribromomethyl-S-triazine and 2-methoxy-4-methyl-6-trichloromethyl-S-triazine;

Compounds described in JP-A-62-58241:

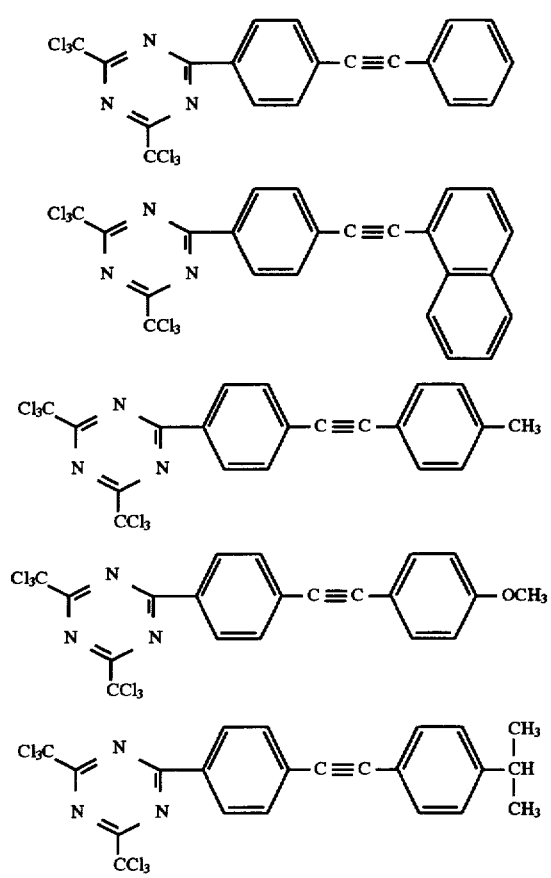

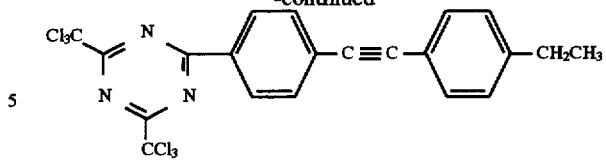

Compounds described in JP-A-5-281728:

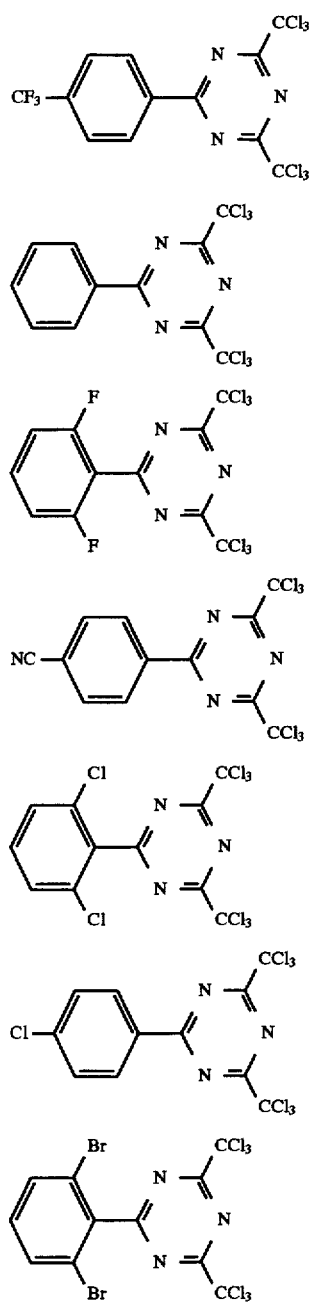

Compounds described below which can be easily synthesized by a person skilled in the art according to the synthesis method described in M. P. Hutt, E. F. Elslager and L. M. Herbel, *Journal of Heterocyclic Chemistry*, Vol. 7 (No. 3), page 511 et seq. (1970):

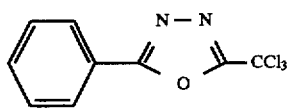
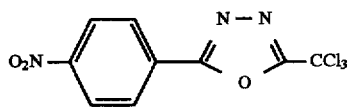
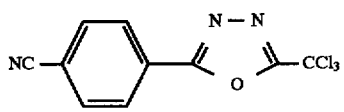
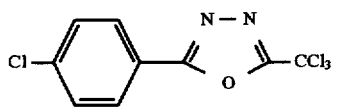
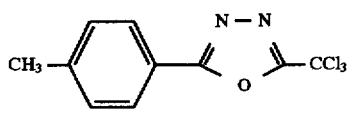
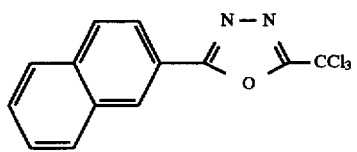
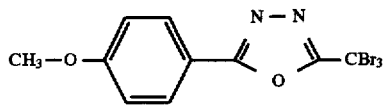
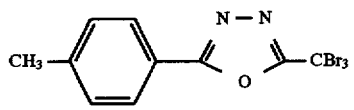
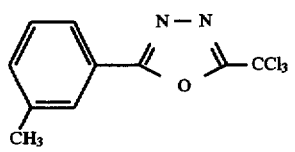
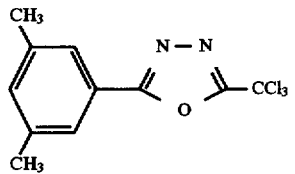
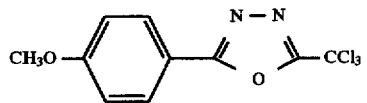
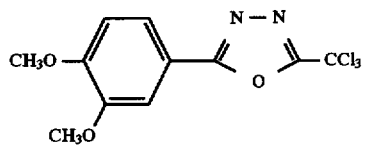

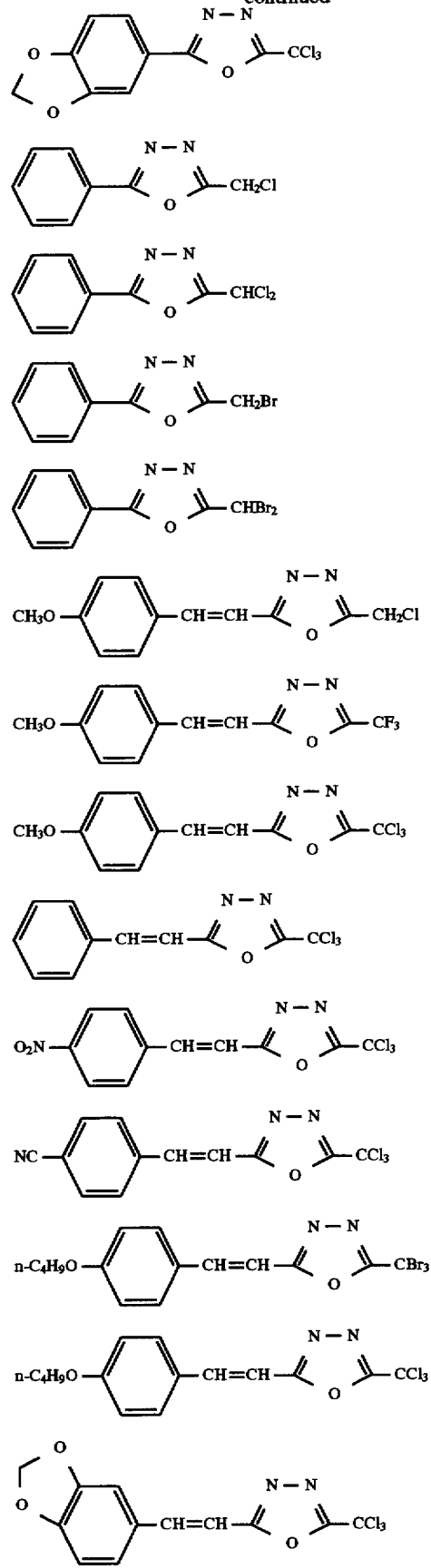

-continued
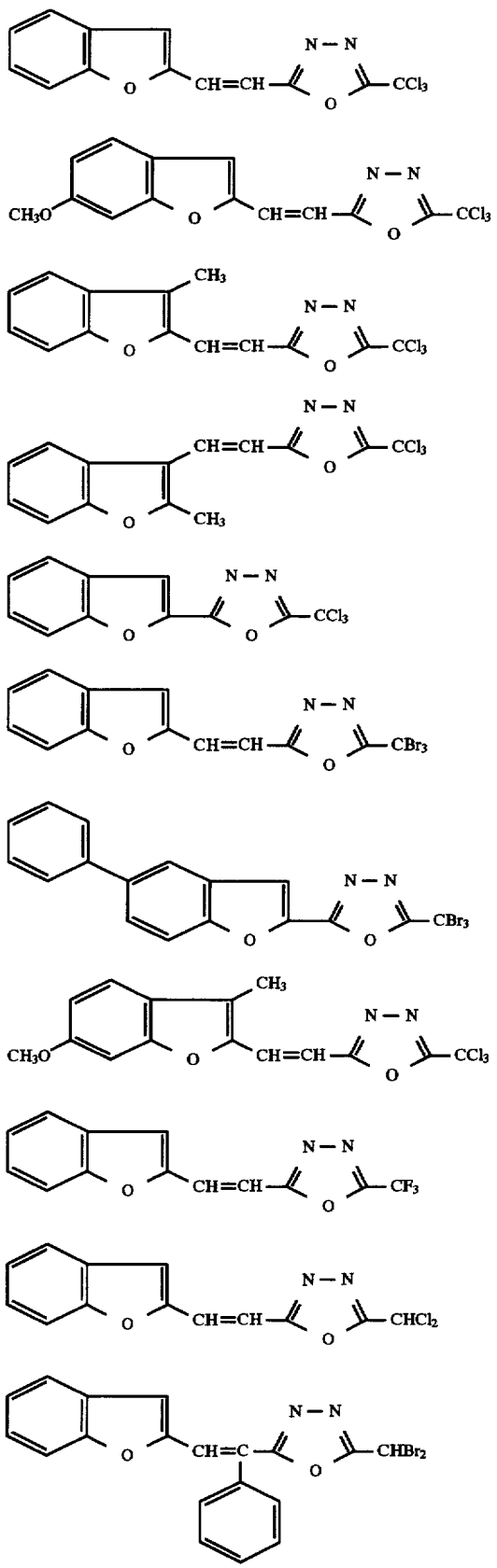

-continued
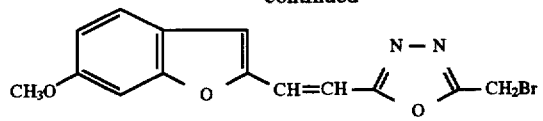
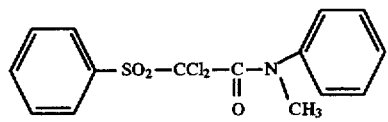
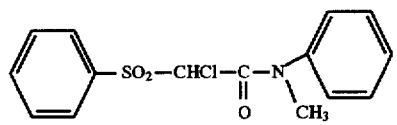
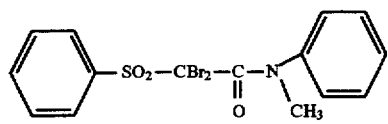
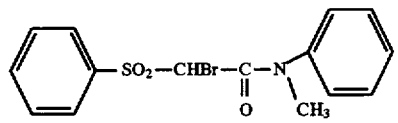
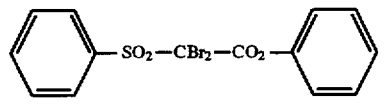
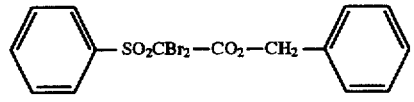
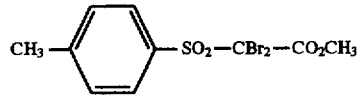
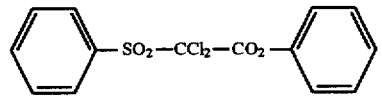
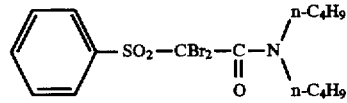
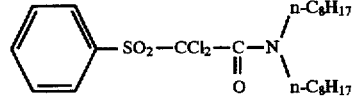
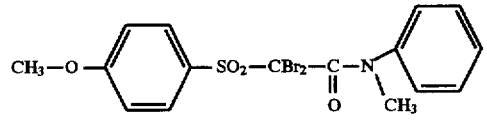
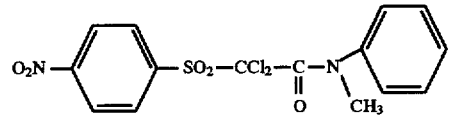
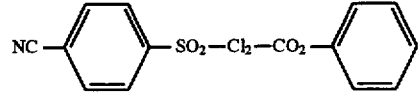

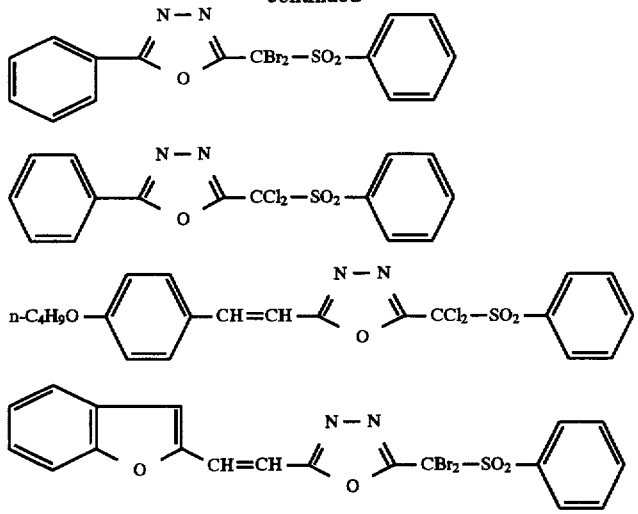

Compounds described in German Patent No. 2,641,100 such as 4-(4-methoxystyryl)-6-(3,3,3-trichloropropenyl)-2-pyrone and 4-(3,4,5-trimethoxystyryl)-6-trichloromethyl-2-pyrone;

Compounds described in German Patent No. 3,333,450:

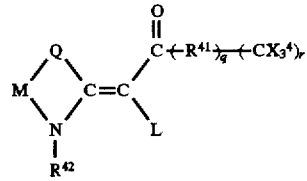

| | $R^{42}$ | M | L | q | $(CX^4_3)_r$ | $R^{41}$ |
|---|---|---|---|---|---|---|
| 1 | $C_2H_5$ | 1,2-phenylene | H | 1 | 4-$CCl_3$ | Bz |
| 2 | $CH_2C_6H_5$ | 1,2-phenylene | H | 1 | 4-$CCl_3$ | Bz |
| 3 | $C_2H_5$ | 1,2-phenylene | H | 1 | 3-$CCl_3$ | Bz |

-continued

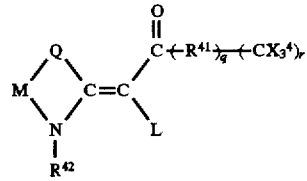

| | $R^{42}$ | M | L | q | $(CX^4_3)_r$ | $R^{41}$ |
|---|---|---|---|---|---|---|
| 4 | $C_2H_5$ | 1,2-phenylene | H | 1 | 4-$CF_3$ | Bz |
| 5 | $C_2H_5$ | 5-$CH_3$-1,2-phenylene | H | 0 | $CCl_3$ | — |
| 6 | $CH_2C_6H_5$ | 1,2-phenylene | H | 0 | $CCl_3$ | — |
| 7 | $C_2H_4OCH_3$ | 1,2-phenylene | H | 1 | 4-$CCl_3$ | Bz |

Bz: benzene ring

Compounds described in German Patent No. 3,021,590:

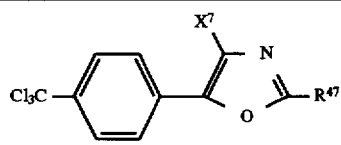

| | $R^{47}$ | $X^7$ |
|---|---|---|
| 1 | 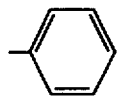 | Cl |
| 2 | 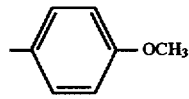 | Cl |
| 3 | 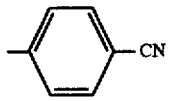 | Cl |

-continued

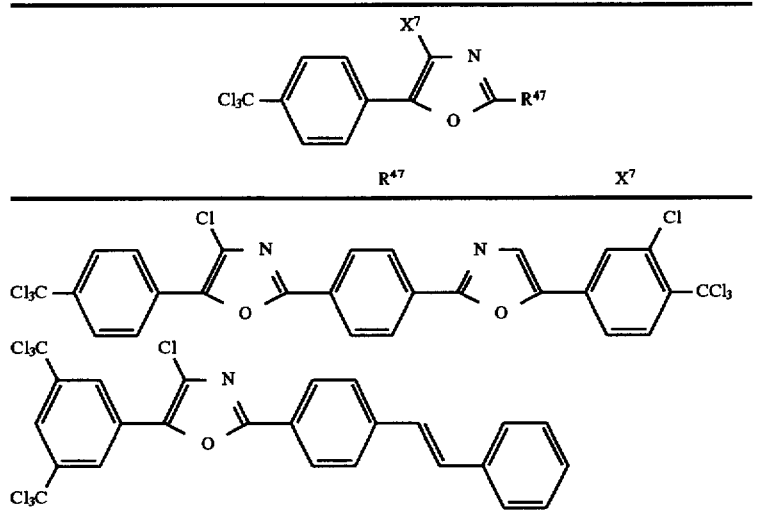

Compounds described in German patent No. 3,021,599:

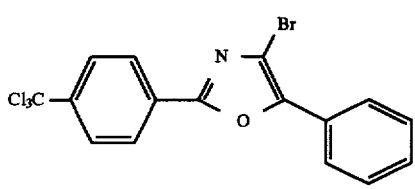

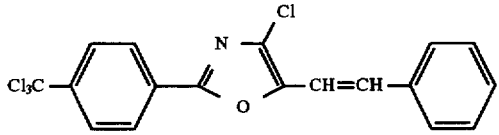

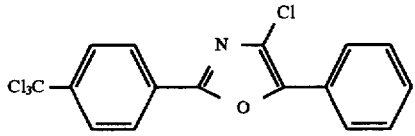

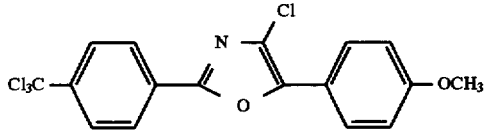

More preferred examples of the component (iii) of the present invention are (c) organic peroxides, (e) hexaarylbi-imidazole compounds, (i) metallocene compounds and (k) compounds having a carbon halogen bond and most preferred example is the trihalomethyl-S-triazine compound represented by formula (VII).

The photopolymerization initiators as component (iii) of the present invention are suitably used individually or in combination of two or more thereof.

Further, it is preferred to let an already known spectral sensitizing dye or dyestuff be present as component (iv) in the photosensitive composition of the present invention. Preferred examples of the spectral sensitizing dye or the dyestuff include polynuclear aromatic compounds (e.g., pyrene, perylene, triphenylene), xanthenes (e.g., Fluorescene, eosine, erythrosine, Rhodamine B, Rose Bengal), cyanines (e.g., thiacarbocyanine, oxacarbocyanine), merocyanines (e.g., merocyanine, carbomerocyanine), thiazines (e.g., thionine, methylene blue, toluidine blue), acridines (e.g., Acridine orange, chloroflavin, acriflavine), phthalocyanines (e.g., phthalocyanine, metallophthalocyanine), porphyrins (e.g., tetraphenyl porphyrin, center metal-substituted porphyrin), chlorophylis (e.g., chlorophyll, chlorophyllin, center metal-substituted chlorophyll), metal complexes such as

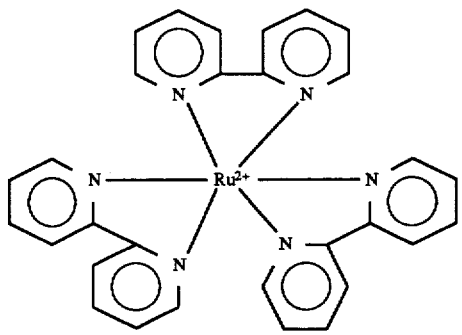

anthraquinones (e.g., anthraquinone) and squaliums (e.g., squalium).

More preferred examples of the spectral sensitizing dye or the dyestuff as component (iv) include:

styryl-based dyes described in JP-B-37-13034 such as

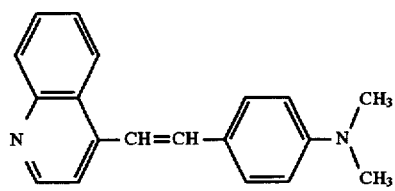

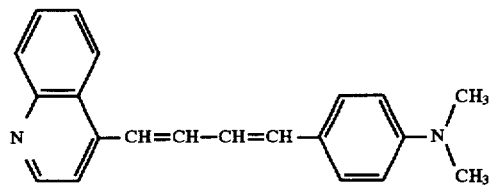

cation dyes described in JP-A-62-143044 such as
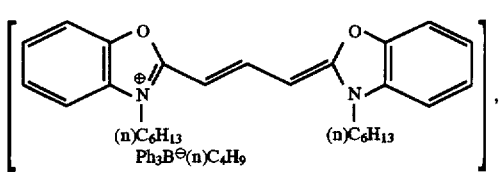
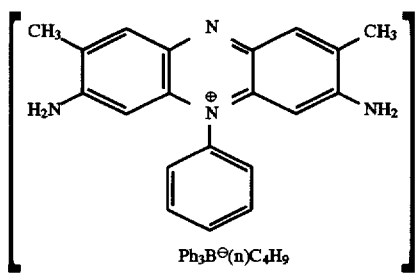
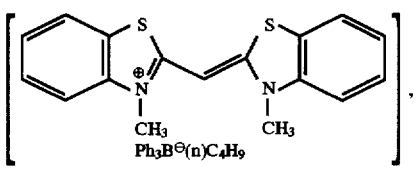
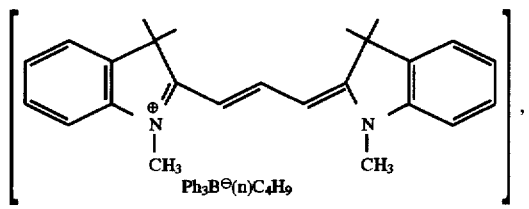
quinoxalium salts described in JP-B-59-24147 such as
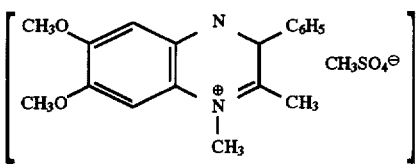
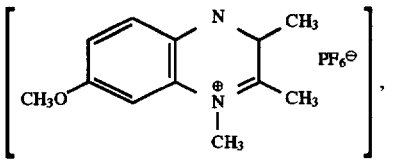
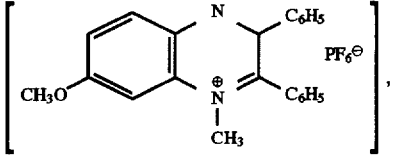
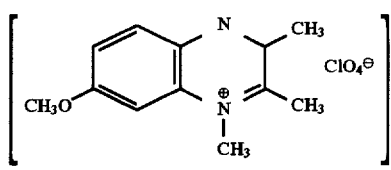
new Methylene Blue compounds described in JP-A-64-33104 such as
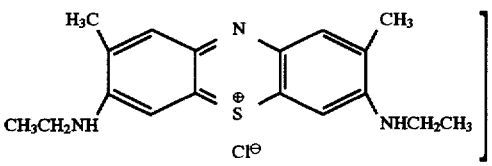
anthraquinones described in JP-A-64-56767 such as
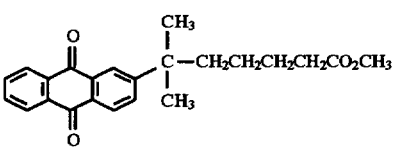
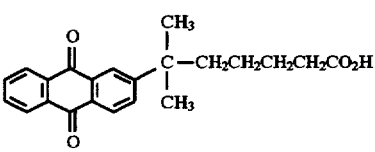
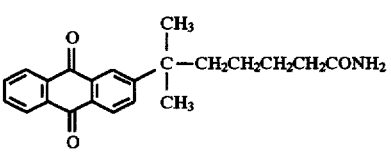
benzoxanthene dyes described in JP-A-2-1714;
acridines described in JP-A-2-226148 and JP-A-2-226149 such as

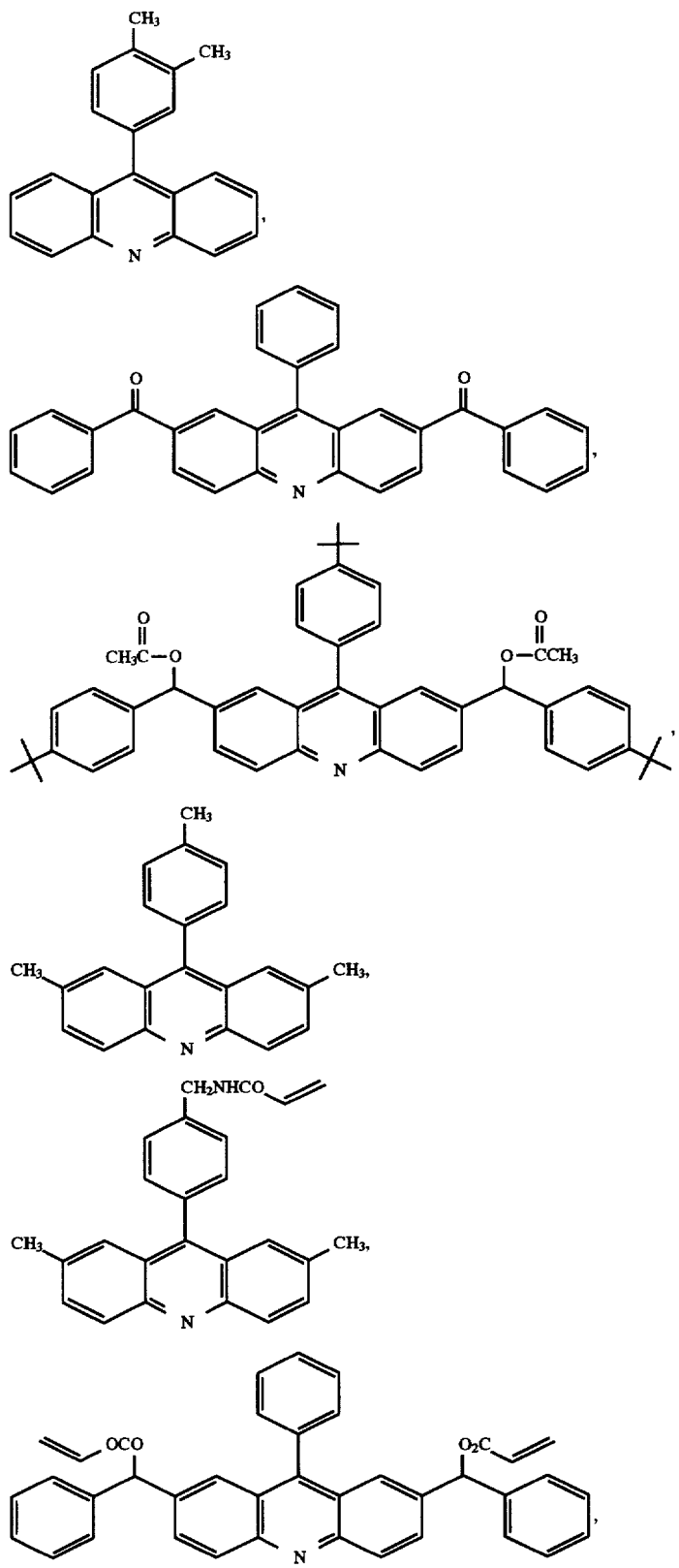

| 75 | 76 |
|---|---|
| pyrylium salts described in JP-B-40-28499 such as | cyanines described in JP-B-46-42363 such as |
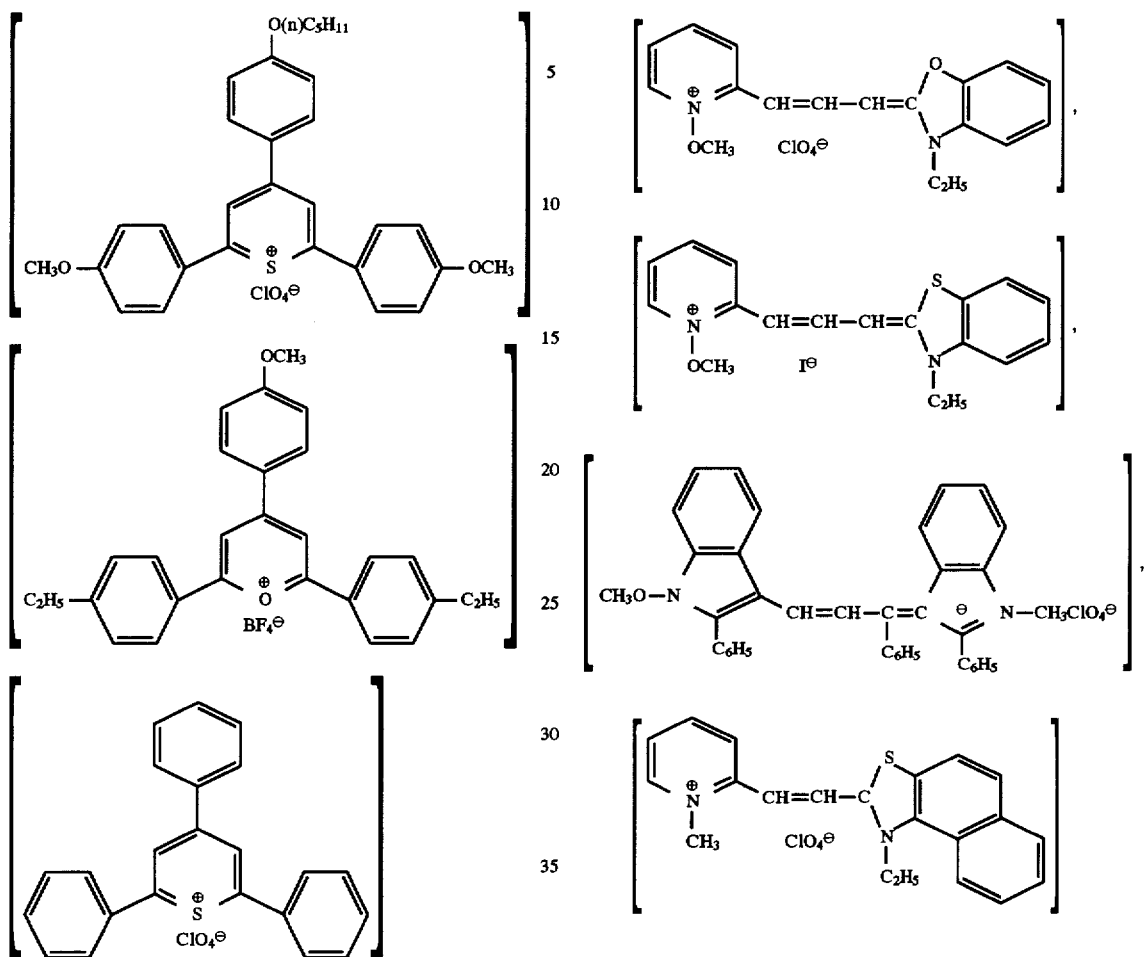
benzofurane dyes described in JP-A-2-63053 such as
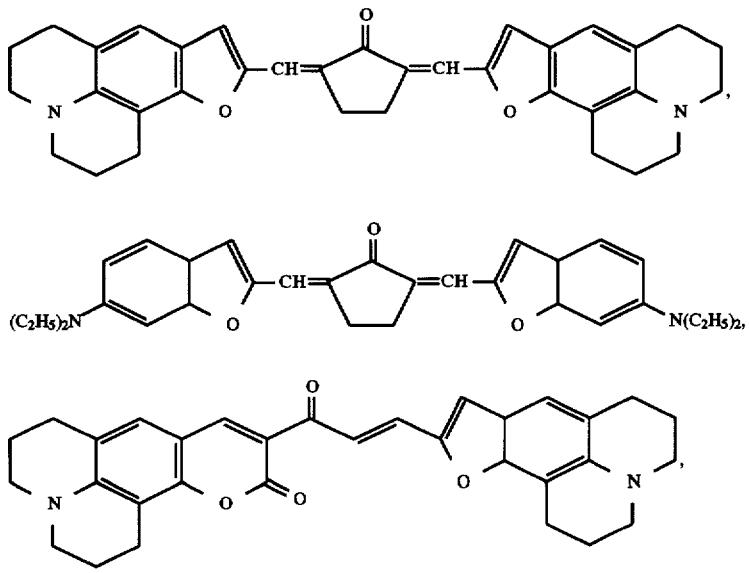

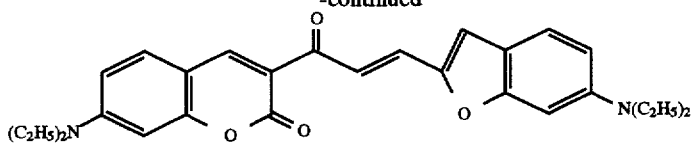
conjugated ketone dyes described in JP-A-2-85858 and JP-A-2-216154 such as
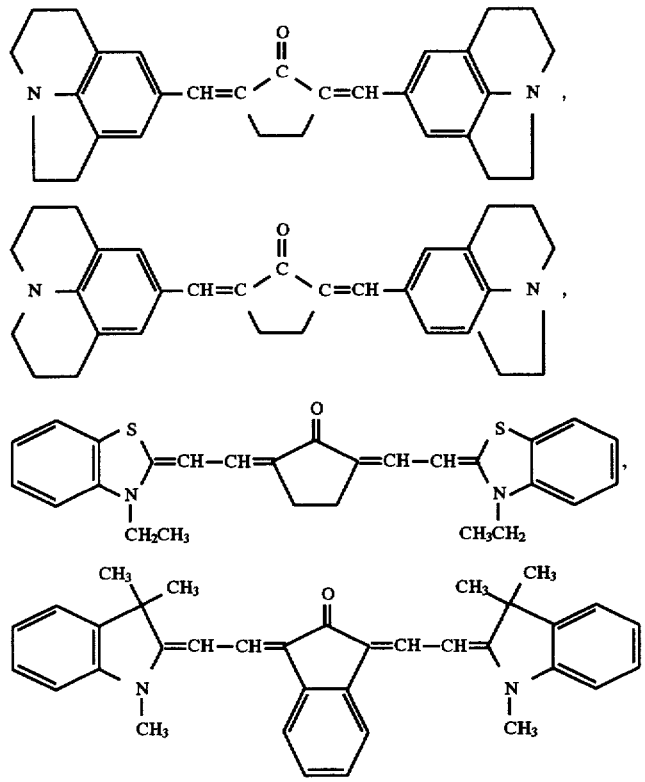
dyes described in JP-A-57-10605; azocinnamylidene derivatives described in JP-B-2-30321 such as
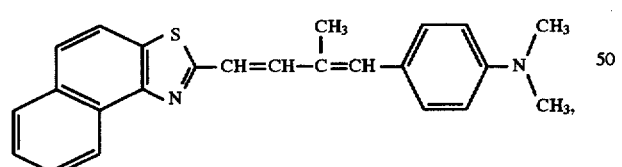
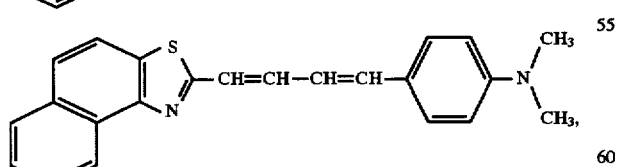
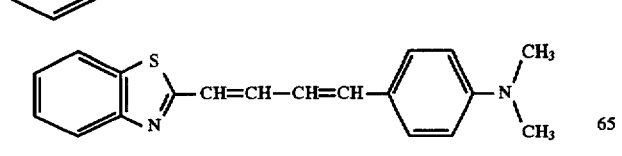
cyanine-based dyes described in JP-A-1-287105 such as
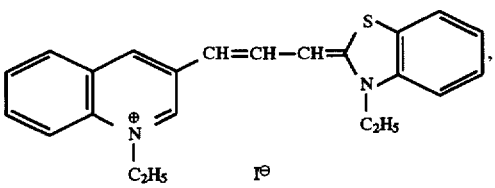
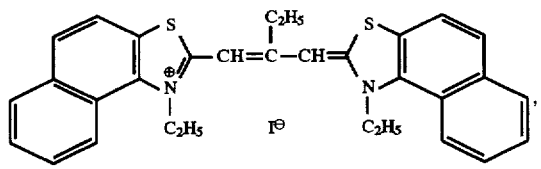
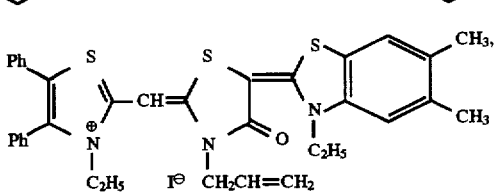

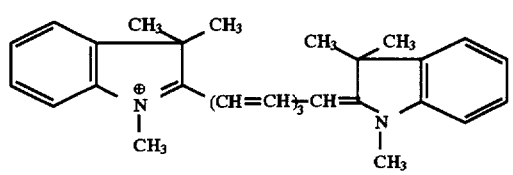

xanthene-based dyes described in JP-A-62-31844, JP-A-62-31848 and JP-A-62-143043 such as

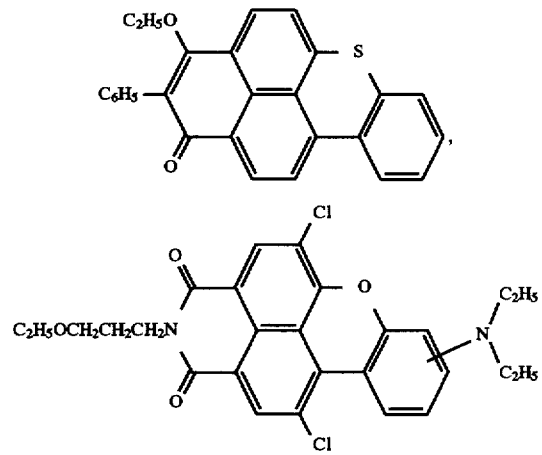

aminostyryl ketones described in JP-B-59-28325 such as

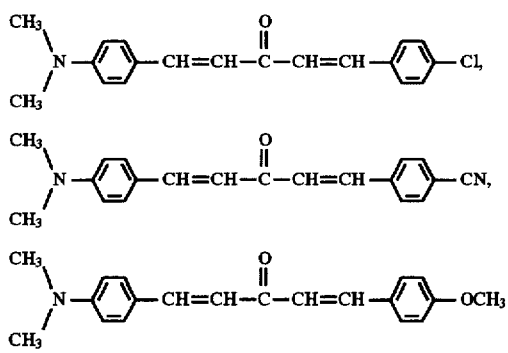

merocyanine dyes represented by the following formulae [1] to [8] described in JP-B-61-9621:

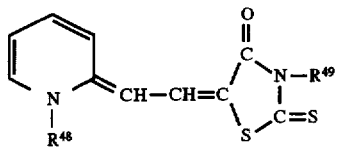

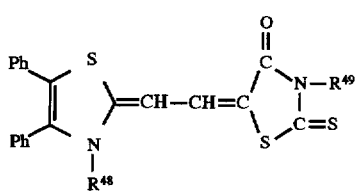

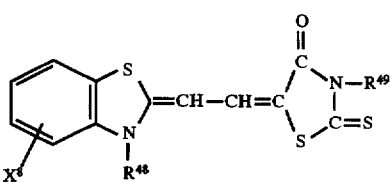

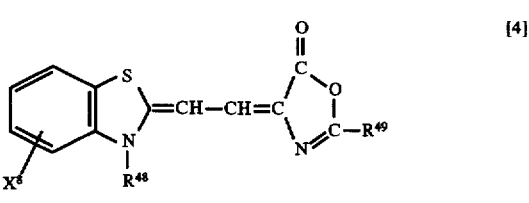

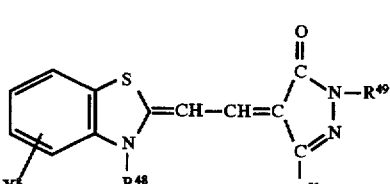

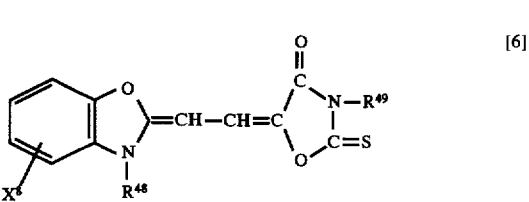

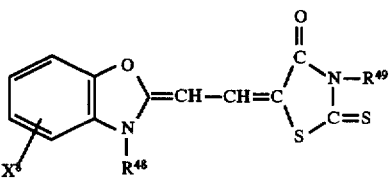

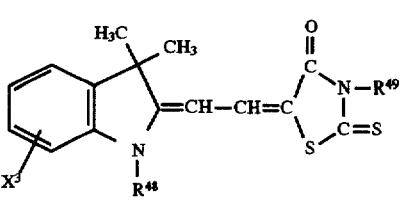

(wherein in formula [3] to [8], $X^8$ represents a hydrogen atom, an alkyl group, a substituted alkyl group, an alkoxy group, an aryl group, a substituted aryl group, an aryloxy group, an aralkyl group or a halogen atom, in formula [2], Ph represents a phenyl group and in formulae [1] to [8], $R^{48}$, $R^{49}$ and $R^{50}$, which may be the same or different, each represents an alkyl group, a substituted group, an alkenyl group, an aryl group, a substituted aryl group or an aralkyl group);

dyes represented by the following formulae [9] to [11] described in JP-A-2-179643:

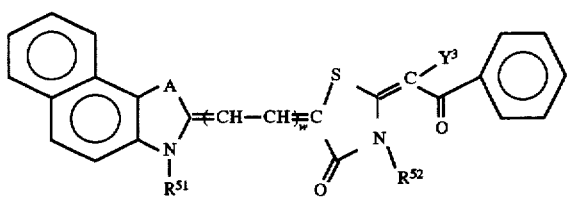 [9]

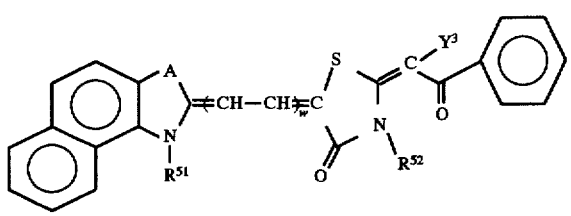 [10]

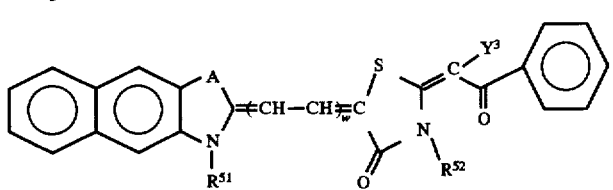 [11]

(wherein A represents an oxygen atom, a sulfur atom, a selenium atom, a tellurium atom, an alkyl- or aryl-substituted nitrogen atom or a dialkyl-substituted carbon atom, $Y^3$ represents a hydrogen atom, an alkyl group, a substituted alkyl group, an aryl group, a substituted aryl group, an aralkyl group, an acyl group or a substituted alkoxycarbonyl group, $R^{51}$ and $R^{52}$ each represents a hydrogen atom, an alkyl group having from 1 to 18 carbon atoms or a substituted alkyl group having from 1 to 18 carbon atoms substituted by a substituent such as $R^{53}O-$,

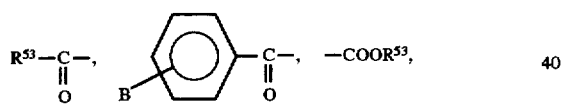

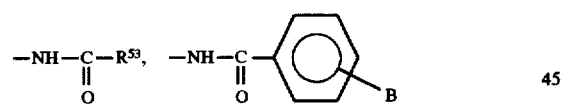

$-(CH_2CH_2O)_x-R^{53}$ or a halogen atom (e.g., F, Cl, Br, I) (wherein $R^{53}$ represents a hydrogen atom or an alkyl group having from 1 to 10 carbon atoms and B represents a dialkylamino group, a hydroxyl group, an acyloxy group, a halogen atom or a nitro group), w represents an integer of from 0 to 4 and x represents an integer of from 1 to 20);

merocyanine dyes represented by the following formula [12] described in JP-A-2-244050:

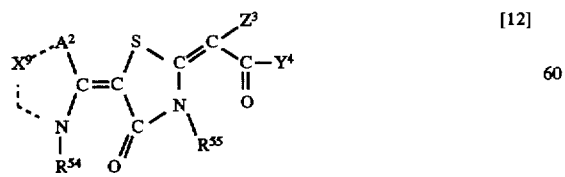 [12]

(wherein $R^{54}$ and $R^{55}$ each independently represents a hydrogen atom, an alkyl group, a substituted alkyl group, an alkoxycarbonyl group, an aryl group, a substituted aryl group or an aralkyl group, $A^2$ represents an oxygen atom, a sulfur atom, a selenium atom, a tellurium atom, an alkyl- or aryl-substituted nitrogen atom or a dialkyl-substituted carbon atom, $X^9$ represents a nonmetallic atom group necessary for forming a nitrogen-containing heterocyclic 5-membered ring, $Y^4$ represents a substituted phenyl group, an unsubstituted or substituted polynuclear aromatic ring or an unsubstituted or substituted heteroaromatic ring, $Z^3$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group and $Z^3$ and $Y^4$ may be combined with each other to form a ring), of which preferred specific examples are set forth below:

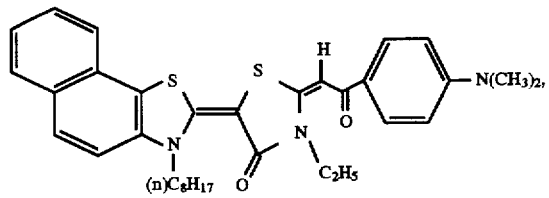

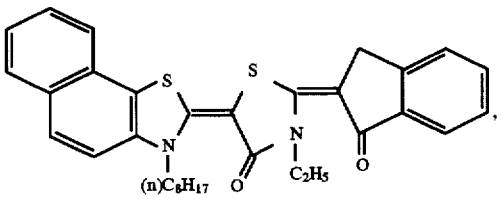

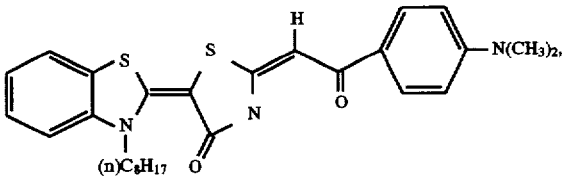

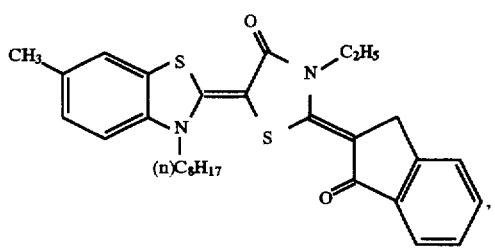

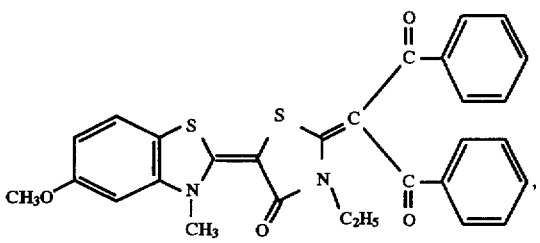

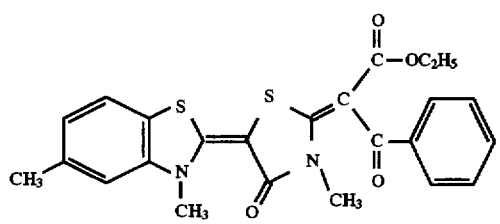

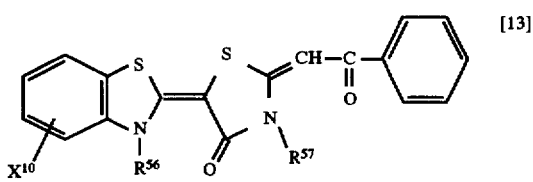

merocyanine dyes represented by the following formula [13] described in JP-B-59-28326:

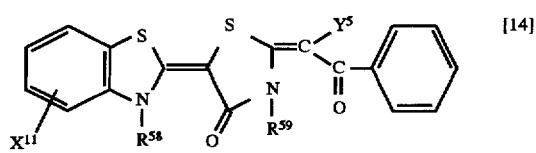

[13]

(wherein $R^{56}$ and $R^{57}$, which may be the same or different, each represents a hydrogen atom, an alkyl group, a substituted alkyl group, an aryl group, a substituted aryl group or an aralkyl group and $X^{10}$ represents a substituent having a Hammett's σ value of from −0.9 to +0.5);

merocyanine dyes represented by the following formula [14] described in JP-A-59-89303:

[14]

(wherein $R^{58}$ and $R^{59}$ each represents a hydrogen atom, an alkyl group, a substituted alkyl group, an aryl group, a substituted aryl group or an aralkyl group, $X^{11}$ represents a substituent having a Hammett's σ value of from −0.9 to +0.5 and $Y^5$ represents a hydrogen atom, an alkyl group, a substituted alkyl group, an aryl group, a substituted aryl group, an aralkyl group, an acyl group or an alkoxycarbonyl group), of which preferred specific examples are set forth below:

and merocyanine dyes represented by the following formula [15] described in Japanese Patent Application No. 6-269047:

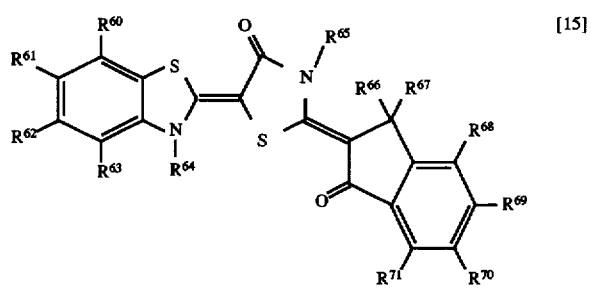

[15]

(wherein $R^{60}$, $R^{61}$, $R^{62}$, $R^{63}$, $R^{68}$, $R^{69}$, $R^{70}$ and $R^{71}$ each independently represents a hydrogen atom, a halogen atom, an alkyl group, a substituted alkyl group, an aryl group, a substituted aryl group, a hydroxyl group, a substituted oxy group, a mercapto group a substituted thio group, an amino group, a substituted amino group, a substituted carbonyl group, a sulfo group, a sulfonate group, a substituted sulfinyl group, a substituted sulfonyl group, a phosphono group, a substituted phosphono group, a phosphonate group, a substituted phosphonate group, a cyano group or a nitro group or $R^{60}$ and $R^{61}$, $R^{61}$ and $R^{62}$, $R^{62}$ and $R^{63}$, $R^{68}$ and $R^{69}$, $R^{69}$ and $R^{70}$ or $R^{70}$ and $R^{71}$ may be combined with each other to form an aliphatic or aromatic ring, $R^{64}$ represents a hydrogen atom, an alkyl group, a substituted alkyl group, an aryl group or a substituted aryl group, $R^{65}$ represents a substituted or unsubstituted alkenylalkyl group or a substituted or unsubstituted alkynylalkyl group and $R^{66}$ and $R^{67}$ each independently represents a hydrogen atom, a halogen atom, an alkyl group, a substituted alkyl group, an aryl group, a substituted aryl group or a substituted carbonyl group), of which preferred specific examples include:

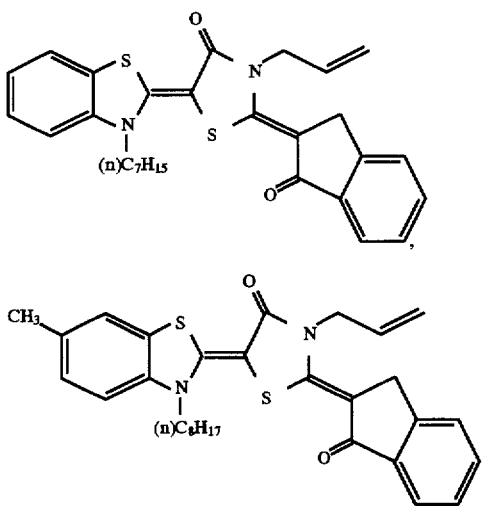

Still more preferred examples of component (iv) of the present invention are merocyanine dyes described in JP-B-61-9621, merocyanine dyes described in JP-A-2-179643, merocyanine dyes described in JP-A-2-244050, merocyanine dyes described in JP-B-59-28326, merocyanine dyes described in JP-A-59-89303 and merocyanine dyes described in Japanese Patent Application No. 6-269047.

The spectral sensitizing dyes or dyestuffs as component (iv) of the present invention are suitably used individually or in combination of two or more thereof.

The photopolymerizable composition of the present invention may contain a known compound having a function to further improve sensitivity or to prevent polymerization inhibition due to oxygen, as a co-sensitizer.

One example of the co-sensitizer is an amine and examples thereof include the compounds described in M. R. Sander, et al., *Journal of Polymer Society*, Vol. 10, p. 3173 (1972), JP-B-44-20189, JP-A-51-82102, JP-A-52-134692, JP-A-59-138205, JP-A-60-84305, JP-A-62-18537, JP-A-64-33104 and *Research Disclosure*, No. 33825. Specific examples thereof include triethanolamine, ethyl p-dimethylaminobenzoate, p-formyldimethylaniline and p-methylthiodimethylaniline.

Other examples of the co-sensitizer are a thiol and a sulfide and examples thereof include thiol compounds described in JP-A-53-702, JP-B-55-500806 and JP-A-5-142772 and disulfide compounds described in JP-A-56-75643. Specific examples thereof include 2-mercaptobenzothiazole, 2-mercaptobenzoxazole, 2-mercaptobenzimidazole, 2-mercapto-4(3H)-quinazoline and β-mercaptonaphthalene.

Still other examples of the co-sensitizer are an amino acid compound (e.g., N-phenylglycine), an organometallic compound described in JP-B-48-42965 (e.g., tributyltin acetate), a hydrogen donor described in JP-B-55-34414, a sulfur compound described in JP-A-6-308727 (e.g. trithian), a phosphorus compound described in JP-A-6-250389 (e.g., diethyl phosphite) and Si-H and Ge-H compounds described in Japanese Patent Application No. 6-191605.

The components (ii), (iii) and (iv) in the composition of the present invention each is added in an amount of from 0.01 to 60 wt %, more preferably from 1 to 30 wt %, based on the total of the photopolymerizable ethylenically unsaturated compound and a binder and a liner organic high molecular polymer which are added, if desired.

The suitable ratio of component (ii) to component (iii) for use in the present invention is such that the component (iii) is used in an amount of from 0.01 to 50 parts by weight, preferably from 0.02 to 20 parts by weight, most preferably from 0.05 to 10 parts by weight, per 1 part by weight of the oxime ether as component (ii).

The suitable ratio of component (ii) to component (iv) for use in the present invention is such that the component (iv) is used in an amount of from 0.01 to 50 parts by weight, preferably from 0.02 to 20 parts by weight, most preferably from 0.05 to 10 parts by weight, per 1 part by weight of the oxime ether as component (ii).

In the case of using the above-described co-sensitizer, it is suitably used in an amount of from 0.01 to 50 parts by weight, more preferably from 0.02 to 20 parts by weight, most preferably from 0.05 to 10 parts by weight, per 1 part by weight of the oxime ether as component (ii).

The photopolymerizable composition of the present invention preferably contains a linear organic high molecular polymer as a binder. The "linear organic high molecular polymer" may be any polymer as long as it is a linear organic high molecular polymer having compatibility with the photo-polymerizable ethylenically unsaturated compound. Preferably, a water- or alkalescent water-soluble or swellable linear organic high molecular polymer capable of water development or alkalescent water development is selected. The linear organic high molecular polymer is used not only as a film forming agent of the composition but also as a water, alkalescent water or organic solvent developer which is appropriately selected depending on the use. For example, when a water-soluble organic high molecular polymer is used, water development can be carried out. This kind of a linear organic high molecular polymer includes an addition polymer having a carboxylic acid group on the side chain and examples thereof include a methacrylic acid copolymer, an acrylic acid copolymer, an itaconic acid copolymer, a crotonic acid copolymer, a maleic acid copolymer and a partially esterified maleic acid copolymer described in JP-A-59-44615, JP-B-54-34327, JP-B-58-12577, JP-B-54-25957, JP-A-54-92723, JP-A-59-53836 and JP-A-59-71048. Further, an acidic cellulose derivative having a carboxylic acid group similarly on the side chain is included. An addition product of a cyclic acid anhydride to the addition polymer having a hydroxyl group may also be useful. Among these, a [benzyl (meth)acrylate/(meth)acrylic acid/other addition polymerizable vinyl monomer, if desired] copolymer and an [allyl (meth)acrylate/(meth) acrylic acid/other addition polymerizable vinyl monomer, if desired] copolymer are preferred. In addition, polyvinyl pyrrolidone and polyethylene oxide are useful as the water-soluble linear organic polymer. Further, an alcohol-soluble polyamide and a polyether of 2,2-bis(4-hydroxyphenyl) propane with epichlorohydrin are also useful so as to increase the strength of the cured film. The above-described linear organic high molecular polymer can be mixed into the entire composition in any optional amount. However, if the mixing amount exceeds 90 wt %, disadvantageous results may be caused in view of the strength of an image formed and the like. The mixing amount is preferably from 30 to 85%. The weight ratio of the photopolymerizable ethylenically unsaturated compound to the linear organic high molecular polymer is preferably from 1/9 to 7/3, more preferably from 3/7 to 5/5.

In the present invention, in addition to the above-described fundamental components, a slight amount of a thermal polymerization inhibitor is preferably added so as to prevent unnecessary thermal polymerization of the polymerizable ethylenically unsaturated compound during the production or storage of the photosensitive composition. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitrosophenylhydroxylamine primary cerium salt. The addition amount of the thermal polymerization inhibitor is preferably from about 0.01 to about 5 wt % based on the weight of the entire composition. Also, if desired, a higher fatty acid derivative such as a behenic acid and a behenic acid amide may be added to disperse unevenly on the surface of the photosensitive layer during the drying process after coating so as to prevent the polymerization inhibition due to oxygen. The addition amount of the higher fatty acid derivative is preferably from about 0.5 to about 10 wt % of the entire composition. Further, a dye or a pigment may be added for the purpose of coloring the photosensitive layer. The addition amount of the dye or the pigment is preferably from about 0.5 to about 5 wt % of the entire composition. Also, an inorganic filler or other known additives may be added so as to improve physical properties of the cured film.

The photopolymerizable composition of the present invention is usually coated on a support on use. In coating the composition on a support, it is dissolved in various organic solvent before use. Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 wt %. The coverage of the coating solution in terms of the weight after drying is preferably from about 0.1 to about 10 g/m$^2$, more preferably from 0.5 to 5 g/m$^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc and copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film laminated with or having evaporated thereon the above-described metal. Among these supports, an aluminum plate is particularly preferred because it is dimensionally stable to an extreme extent and in addition, cheap. Also, a composite sheet obtained by bonding an aluminum sheet on a polyethylene terephthalate film described in JP-B-48-18327 may be preferably used.

A support having a metal, particularly an aluminum surface is preferably subjected to surface treatment such as graining treatment, dipping treatment in an aqueous solution of sodium silicate, potassium fluorozirconate or phosphate, and anodic oxidation treatment.

An aluminum plate subjected to graining and then to dipping treatment in an aqueous solution of sodium silicate may be preferably used. Further, an aluminum plate subjected to anodic oxidation treatment and then to dipping treatment in an aqueous solution of alkali metal silicate described in JP-B-47-5125 may be suitably used. The above-described anodic oxidation treatment is carried out by applying current to the aluminum plate as an anode in an electrolyte, for example, in an aqueous or non-aqueous solution of an inorganic acid such as phosphoric acid, chromic acid, sulfuric acid or boric acid, of an organic acid such as oxalic acid or sulfamic acid, or of a salt thereof, which solutions may be used individually or in combination of two or more thereof.

The silicate electrodeposition described in U.S. Pat. No. 3,658,662 is also effective.

Also, it is useful to apply a surface treatment comprising a combination of the above-described anodic oxidation treatment and sodium silicate treatment to a support subjected to electrolysis graining as disclosed in JP-B-46-27481, JP-A-52-58602 and JP-A-52-30503.

Further, a support subjected in sequence to mechanical graining, chemical etching, electrolysis graining, anodic oxidation treatment and sodium silicate treatment as disclosed in JP-A-56-28893 is preferred.

Furthermore, a support may be suitably subjected, after the above-described treatments, to undercoating by a water-soluble resin such as a polyvinyl phosphonic acid, a polymer or copolymer having a sulfonic acid group on the side chain, a polyacrylic acid or a water-soluble metal salt (e.g., zinc borate), or a yellow dye or an amine salt.

The above-described treatments to achieve hydrophilicity are effected not only to render the support surface hydrophilic but also to prevent harmful reaction of the photopolymerizable composition to be coated on the support and at the same time, to improve the adhesion to the photosensitive layer.

In order to prevent polymerization inhibition action due to oxygen in air, a protective layer comprising a polymer having an excellent oxygen cutting property, such as polyvinyl alcohol, in particular, polyvinyl alcohol having a saponification degree of 95% or more, or an acidic cellulose, may be provided on the photopolymerizable composition layer on the support. The coating method of the protective layer is described in detail, for example, in U.S. Pat. No. 3,458,311 and JP-A-55-49729.

The photopolymerizable composition of the present invention can be used for usual photopolymerization. Further, the composition can be used in various fields, for example, as a photoresist in producing a printing plate or a printed board. In particular, since the photopolymerizable composition of the present invention has such properties as high sensitivity and wide spectral sensitivity extending even to a visible light region, it can provide good effects when it is applied to a photosensitive material for a visible light laser such as an Ar$^+$laser or a YAG-SHG laser.

Further, since the photopolymerizable composition of the present invention is highly sensitive and shows photosensitivity to visible light, it can be advantageously used particularly for an image formation system using a microcapsule.

The application to the image formation system using a microcapsule is described, for example, in JP-A-57-197538, JP-A-61-130945, JP-A-58-88739, JP-A-58-88740 and European Patent No. 223,587A1. For example, this image formation method comprises coating a microcapsule containing a photopolymerization initiator composition consisting of an ethylenic vinyl compound, a photopolymerization initiator and a dye precursor on a support, imagewise exposing the resulting photosensitive sheet to cure microcapsules on the exposed area, superposing a developer sheet thereon and applying pressure throughout the sheet to rapture the microcapsules on the unexposed area, whereby a dye image-forming material (e.g., a dye precursor) is transferred to an image-receiving element (e.g., developer layer) to form colors thereon.

The photosensitive material using the photopolymerizable composition of the present invention is subjected to image exposure and the unexposed area of the photosensitive layer is removed by a developer to obtain an image. In using the photopolymerizable composition for producing a lithographic printing plate, the developer described in JP-B-57-7427 is preferred and an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia or of an organic alkali agent such as monoethanolamine or diethanolamine is suitably used therefor. The alkali agent is added to give a concentration of from 0.1 to 10 wt %, preferably from 0.5 to 5 wt %.

The above-described alkaline aqueous solution may contain, if desired, a surface active agent or an organic solvent such as benzyl alcohol, 2-phenoxyethanol or 2-butoxyethanol, in a small amount. Examples thereof include those described in U.S. Pat. Nos. 3,375,171 and 3,615,480. Further, the developers described in JP-A-50-26601, JP-A-58-54341, JP-B-56-39464 and JP-B-56-42860 are also excellent.

The photopolymerizable composition of the present invention shows high sensitivity to active light rays over a wide range of from ultraviolet ray to visible light and at the same time, the photosensitive material using the photopolymerizable composition of the present invention is improved in the storage stability. Further, the development precipitate generated from the developer waste after development of the photosensitive material is restrained.

The present invention will be described below in greater detail by referring to the examples, but the present invention should not be construed as being limited to these examples.

Synthesis of Oxime Ether

In general, the oxime ether is easily synthesized via an oxime form from aldehyde or ketone as shown in the following reaction formula 1 according to the method described, for example, in A. Lachman, C. R. Noller, *Org. Synth.*, II, 70; and E. J. Corey, M. Petrzilka, Y. Veda, *Helv. Chim. Acta*, 60, 2294 (1977).

Reaction formula 1

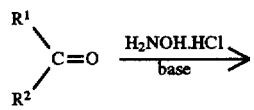

aldehyde or ketone

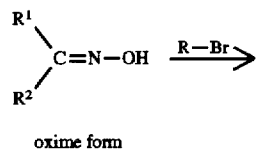

oxime form

-continued
Reaction formula 1

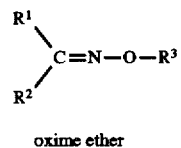

oxime ether (in the formulae, $R^1$, $R^2$ and $R^3$ each has the same meaning as defined above).

The aldehyde or ketone as a starting material may be, for example, a commercial product or may be easily synthesized according to, in case of aldehyde, a method using oxidation of a primary alcohol described in C. D. Hurd, R. N. Meinert, *Org. Synth.*, II, 541 (1943), a method using reduction of an acid chloride described in A. I. Rachlin, H. Gurien, D. P. Wagner, *Org. Synth.*, 51, 8 (1971), a method using reduction of an amide described in H. C. Brown, A. Tsukamoto, *J. Am. Chem. Soc.*, 81, 502 (1959), ibid., 83, 4549 (1961) and ibid., 86, 1089 (1964) or a method using formylation to an aromatic ring described in W. E. Truce, *Org. React.*, 9, 37 (1957); in case of ketone, a method using oxidation of a secondary alcohol described in M. S. Kharsch, et al, *J. Org. Chem.*, 18, 1051 (1953), a method using a benzoin condensation described in W. S. Ide, J. S. Buch, *Org. React.*, 4, 273 (1948), a method using reaction of an organic lithium compound with a carboxylic acid described in M. J. Torgenson, *Org. React.*, 18, 59 (1970) or a method using the Friedel-Crafts reaction described in E. Berliner, *Org. Reacts*, 5, 229 (1949); and particularly in case of an α-substituted ketone, a method described in JP-A-1-139554 or a method described in JP-B-6-35427.

SYNTHESIS EXAMPLE 1

Synthesis of compound III-4

NaOH (240.0 g), C₂H₅OH (0.8 l) and water (0.16 l), based on a commercial product, 2-methyl-4'-(methylthio)-2-morpholinopropiophenone (produced by Ciba Geigy) (279.4 g), were placed in a flask and refluxed under heating for 3 hours. Then, the reaction mixture was poured little by little in a beaker containing water (3 l) to deposit white crystals (oxime form). The resulting white crystals were recovered by filtration and vacuum dried to obtain 235.5 g of white crystals (oxime form). The yield was 90% and the melting point was from 185.0° to 186.0° C.

Then, the thus-obtained oxime form (235.5 g), KOH (67.3 g), benzyl bromide (153.9 g) and acetone (1.0 l) were placed in a flask and refluxed under heating for 5 hours. Thereafter, the resulting reaction mixture was poured little by little in a beaker containing ice water (3 l), adjusted to have a pH of 8 with concentrated hydrochloric acid and then stirred at 5° C. for 2 hours to deposit colorless crystals (crude III-4). The resulting colorless crystals were recrystallized from methanol to obtain 230.7 g of Compound III-4 in a purity of 99% or more at a yield of 75%. The structure of Compound III-4 was verified by ¹H NMR, IR, MASS spectrum. The melting point was from 87.5° to 88.0° C.

SYNTHESIS EXAMPLE 2

Synthesis of Compound IV-5

The oxime form (white crystals) of an intermediate obtained in Synthesis Example 1 (58.9 g) was placed in a flask and tetrahydrofuran (200 g) was added thereto and dissolved under heating. NaOCH₃ (11.9 g) was added thereto and the mixture was stirred for 1 hour and then allowed to cool to 40° C. Methyl bromoacetate (36.7 g) was added thereto and the mixture was heated at 50° C. for 3 hours. After 3 hours, water (1.5 l) was poured therein, the pH of the solution was adjusted to 8 with concentrated hydrochloric acid, the solution was extracted with ethyl acetate, the extract was dried over sodium sulfate and filtered through a filter and the filtrate was concentrated under reduced pressure. To the resulting oily product, methanol was added and the mixture was allowed to stand under ice cooling for one day to deposit colorless crystals. The resulting crystal was verified to be Compound IV-5 in a purity of 98% or more by $^1$H NMR, IR, MASS spectrum. The production was 51.3 g, the yield was 70% and the melting point was from 75.5° to 76.5° C.

The compounds represented by formula (I) of the present invention other than Compounds III-4 and IV-5 can be easily synthesized by the same method.

EXAMPLES 1 TO 18 AND COMPARATIVE EXAMPLES 1 TO 3

A 0.30 mm-thick aluminum plate was subjected to the graining of the surface thereof using a nylon blush and a water suspension of 400-mesh pumice stones and then well washed with water. After dipping in a 10% sodium hydroxide at 70° C. for 60 seconds to effect etching, the plate was washed with flowing water, neutralization-washed with a 20% nitric acid and then washed with water. The resulting plate was subjected to electrolysis graining treatment using a sinewaveform alternating current under conditions of $V_A=12.7$ V in a 1% aqueous nitric acid solution at an anode electricity quantity of 160 coulomb/dm$^2$. The surface roughness measured was 0.6 μ (Ra indication). Subsequently, the plate was dipped in a 30% aqueous sulfuric acid solution to effect desmutting at 55° C. for 2 minutes and then subjected to anodic oxidation treatment in a 20% aqueous sulfuric acid solution at a current density of 2 A/dm$^2$ for 2 minutes to give an anodic oxidation film amount of 2.7 g/m$^2$.

A photopolymerizable composition having the following composition was coated on the thus-treated aluminum plate to give a dry coating weight of 1.4 g/m$^2$ and then dried at 80° C. for 2 minutes to form a photosensitive layer.

| Composition | |
|---|---|
| Pentaerythritol tetraacrylate | 2.0 g |
| Allyl methacrylate/methacrylic acid copolymer (copolymerization molar ratio: 80/20) | 2.0 g |
| Component (ii) | X g |
| Component (iii) | Y g |
| Component (iv) | Z g |
| Methyl ethyl ketone | 20 g |

| Composition | |
|---|---|
| Propylene glycol monomethyl ether acetate | 20 g |

On the thus-provided photosensitive layer, a 3 wt % aqueous solution of polyvinyl alcohol (saponification degree: 98 mol %, polymerization degree: 1,000) was coated to give a dry coating weight of 2 g/m$^2$ and dried at 100° C. for 2 minutes to obtain a photosensitive material. The resulting photosensitive material was subjected to the following tests.

The photosensitivity test was conducted using monochromatic light of each of visible light and Ar$^+$ laser light (wavelength: 488 nm). The visible light was irradiated using a tungsten lamp as a light source through a Kenko optical filter BP-49. The photosensitivity was determined using FUJI PS Step Guide (a step tablet having 15 stages, manufactured by Fuji Photo Film Co., Ltd., in which the transmission optical density is 0.05 at the initial stage and increased in sequence by 0.15). The sensitivity was shown by the clear stage number of the PS step guide when exposure was made such that an exposure energy on the film surface area of the photosensitive material became 0.25 mJ. The larger the stage number value, the higher the sensitivity.

The development was conducted by dipping the plate in the following developer at 25° C. for 1 minute.

| Developer | |
|---|---|
| 1K Potassium silicate | 30 g |
| Potassium hydroxide | 15 g |
| $C_{12}H_{25}$—$C_6H_4$—O—$C_6H_4$—$SO_3Na$ | 3 g |
| Water | 1,000 g |

The storage stability test and the development precipitate test were conducted at the same time. The storage stability was examined by observing the presence or absence of deposits through an optical microscope on the photosensitive material prepared above which had been forcedly aged in an oven at 60° C. for 3 days.

TABLE 1

Sensitivity, Storage Stability

| | Component Ratio in Copolymerizable Composition | | | | | | Sensitivity at Exposure (stage number of step wedge) | Storage Stability (presence or absence of deposits) |
|---|---|---|---|---|---|---|---|---|
| | Component (ii) | X g | Component (iii) | Y g | Component (iv) | Z g | | |
| Example 1 | III-3 | 0.50 | A-1 | 0.054 | B-1 | 0.12 | 10 | no deposit |

TABLE 1-continued

Sensitivity, Storage Stability

| | Component Ratio in Copolymerizable Composition | | | | | | Sensitivity at Exposure (stage number of step wedge) | Storage Stability (presence or absence of deposits) |
|---|---|---|---|---|---|---|---|---|
| | Component (ii) | X g | Component (iii) | Y g | Component (iv) | Z g | | |
| Example 2 | III-4 | 0.50 | A-1 | 0.054 | B-2 | 0.12 | 10 | " |
| Example 3 | III-7 | 0.50 | A-1 | 0.054 | B-1 | 0.12 | 10 | " |
| Example 4 | III-8 | 0.50 | A-1 | 0.054 | B-2 | 0.12 | 9 | " |
| Example 5 | III-9 | 0.50 | A-2 | 0.054 | B-1 | 0.12 | 9.5 | " |
| Example 6 | III-14 | 0.50 | A-2 | 0.054 | B-2 | 0.12 | 10.5 | " |
| Example 7 | III-15 | 0.50 | A-2 | 0.054 | B-1 | 0.12 | 10 | " |
| Example 8 | III-21 | 0.50 | A-2 | 0.054 | B-2 | 0.12 | 9 | " |
| Example 9 | IV-3 | 0.50 | A-1 | 0.054 | B-1 | 0.12 | 11 | " |
| Example 10 | IV-4 | 0.50 | A-1 | 0.054 | B-1 | 0.12 | 10 | " |
| Example 11 | IV-5 | 0.50 | A-1 | 0.054 | B-1 | 0.12 | 10.5 | " |
| Example 12 | IV-6 | 0.50 | A-1 | 0.054 | B-1 | 0.12 | 10.5 | " |
| Example 13 | IV-7 | 0.50 | A-1 | 0.054 | B-1 | 0.12 | 10 | " |
| Example 14 | IV-10 | 0.50 | A-2 | 0.054 | B-1 | 0.12 | 10 | " |
| Example 15 | IV-13 | 0.50 | A-2 | 0.054 | B-1 | 0.12 | 11 | no deposit |
| Example 16 | IV-16 | 0.50 | A-2 | 0.054 | B-1 | 0.12 | 9 | " |
| Example 17 | IV-20 | 0.50 | A-2 | 0.054 | B-1 | 0.12 | 9 | " |
| Example 18 | IV-37 | 0.50 | A-2 | 0.054 | B-1 | 0.12 | 9.5 | " |
| Comparative Example 1 | none | | A-1 | 0.054 | B-1 | 0.12 | 8 | " |
| Comparative Example 2 | none | | A-1 | 0.054 | B-2 | 0.12 | 7 | deposit was observed |
| Comparative Example 3 | none | | A-2 | 0.054 | B-1 | 0.12 | 7.5 | no deposit |

It is seen from Table 1 that when component (ii) of the present invention was used, the sensitivity was increased and the storage stability was improved.

TABLE 2

Development Precipitate Test

| | | Component (ii) | X g | Component (iii) | Y g | Component (iv) | Z g | Development Precipitate (processed area: m²) |
|---|---|---|---|---|---|---|---|---|
| Example | 19 | III-1 | 0.50 | A-1 | 0.054 | B-1 | 0.12 | 4 |
| | 20 | III-4 | 0.50 | A-1 | 0.054 | B-1 | 0.12 | 5 |
| | 21 | III-10 | 0.50 | A-1 | 0.054 | B-1 | 0.12 | 5 |
| | 22 | III-28 | 0.50 | A-1 | 0.054 | B-1 | 0.12 | 6 |
| | 23 | IV-5 | 0.50 | A-1 | 0.054 | B-1 | 0.12 | 20 (but not generated) |
| | 24 | IV-10 | 0.50 | A-1 | 0.054 | B-1 | 0.12 | 20 (but not generated) |
| | 25 | IV-13 | 0.50 | A-1 | 0.054 | B-1 | 0.12 | 20 (but not generated) |
| | 26 | IV-19 | 0.50 | A-1 | 0.054 | B-1 | 0.12 | 20 (but not generated) |

EXAMPLES 19 TO 26

A model test for development precipitate was conducted in such a manner that the unexposed photosensitive material (coated plate) prepared above was dipped in the developer described above (1 l) every 2 m² area in the range of from 0 to 20 m² and the developer waste was allowed to stand for 1 week and then visually observed on the presence or absence of deposits (development precipitate). It was examined how much area (m²) of the photosensitive material was processed in the case where development precipitate was generated in the range of from 0 to 20 m². (Accordingly, as the area (m²) processed with the photopolymerizable composition was larger, the photosensitive material was more difficult to cause generation of the development precipitate.)

As is clear from Table 2, the degree of development precipitate greatly depends on the kind of component (ii). Particularly, when the compounds represented by formula (IV) are used as component (ii), the resulting photosensitive materials are more difficult to cause generation of the development precipitate.

Compounds A-1, A-2, B-1 and B-2 in Tables 3, 4 and 5 are shown below.

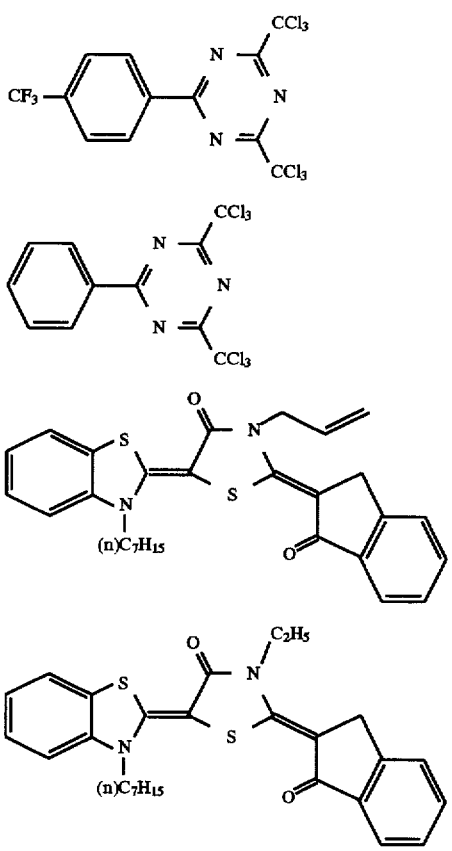

(A-1)

(A-2)

(B-1)

(B-2)

EXAMPLES 27 TO 35 AND COMPARATIVE EXAMPLE 4

A 0.30 mm-thick aluminum plate was subjected to the graining of the surface thereof using a nylon blush and a water suspension of 400-mesh pumice stones and then well washed with water. After dipping in a 10% sodium hydroxide at 70° C. for 60 seconds to effect etching, the plate was washed with flowing water, neutralization-washed with a 20% nitric acid and then washed with water. The resulting plate was subjected to electrolysis graining treatment using a sinewaveform alternating current under conditions of $V_A$=12.7 V in a 1% aqueous nitric acid solution at an anode electricity quantity of 160 coulomb/dm$^2$. The surface roughness measured was 0.6 μ (Ra indication). Subsequently, the plate was dipped in a 30% aqueous sulfuric acid solution to effect desmutting at 55° C. for 2 minutes and then subjected to anodic oxidation treatment in a 20% aqueous sulfuric acid solution at a current density of 2 A/dm$^2$ for 2 minutes to give an anodic oxidation film amount of 2.7 g/m$^2$.

A photopolymerizable composition having the following composition was coated on the thus-treated aluminum plate to give a dry coating weight of 1.4 g/m$^2$ and then dried at 80° C. for 2 minutes to form a photosensitive layer.

| Composition | |
|---|---|
| Pentaerythritol tetraacrylate | 2.0 g |
| Benzyl acrylate/allyl methacrylate/methacrylic acid copolymer (copolymerization molar ratio: 10/70/20) | 2.0 g |
| Component (ii) | 0.5 g |

-continued

| Composition | |
|---|---|
| Methyl ethyl ketone | 20 g |
| Propylene glycol monomethyl ether acetate | 20 g |

On the thus-provided photosensitive layer, a 3 wt % aqueous solution of polyvinyl alcohol (saponification degree: 98 mol %, polymerization degree: 1,000) was coated to give a dry coating weight of 2 g/m$^2$ and dried at 100° C. for 2 minutes to prepare a photosensitive material. The resulting photosensitive material was subjected to the following tests.

The photosensitivity test was conducted to a monochromatic light of 25 nm using a low-pressure mercury lamp as a light source through an optical filter (Model MIF-UW 70φ, manufactured by Nippon Shinku Kogaku KK). The sensitivity was examined in such a manner that the exposure time (second) upon exposure to give the exposure amount of 0.85 mW was varied to 200, 400, 800 and 1,600 seconds and the second number when curing was first caused was determined. The smaller the second number, the higher the sensitivity.

The development was conducted by dipping the plate in the following developer at 25° C. for 1 minute.

| Developer | |
|---|---|
| 1K Potassium silicate | 30 g |
| Potassium hydroxide | 15 g |
| $C_{12}H_{25}$—$C_6H_4$—O—$C_6H_4$—$SO_3Na$ | 3 g |
| Water | 1,000 g |

TABLE 3

Sensitivity Test

| | | Component (ii) | Exposure time necessary for curing (second) |
|---|---|---|---|
| Example | 27 | II-5 | 800 |
| | 28 | II-9 | 800 |
| | 29 | III-1 | 400 |
| | 30 | III-4 | 200 |
| | 31 | III-16 | 200 |
| | 32 | IV-4 | 200 |
| | 33 | IV-8 | 200 |
| | 34 | IV-22 | 200 |
| | 35 | IV-32 | 200 |
| Comparative Example 4 | | none | 1,600 |

It is clearly seen from the results in Table 3 that when component (ii) of the present invention was used, the sensitivity was increased.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising at least the following components (i) and (ii):
   (i) a compound having an addition-polymerizable ethylenically unsaturated bond, and
   (ii) an oxime ether compound, further comprising a photopolymerization initiator and a spectral sensitizing dye or dyestuff.

2. A photopolymerizable composition comprising at least the following components (i) and i(i):
   (i) a compound having an addition-polymerizable ethylenically unsaturated bond, and
   (ii) an oxime ether compound, wherein said oxime ether compound as component (ii) is a compound represented by formula (III):

wherein $R^2$ and $R^1$, which may be the same or different, each represents a hydrocarbon group which may have a substituent and at the same time, may contain an unsaturated bond, or a heterocyclic group or $R^2$ and $R^3$ may be combined with each other to form a ring; $R^{14}$ and $R^{15}$, which may be the same or different, each represents a hydrogen atom, a hydrocarbon group which may have a substituent and at the same time, may contain an unsaturated bond, a heterocyclic group, a hydroxyl group, a substituted oxy group, a mercapto group, a substituted thio group, an amino group or a substituted amino group or $R^{14}$ and $R^{15}$ may be combined with each other to form a ring and represent an alkylene group having from 2 to 8 carbon atoms which may contain

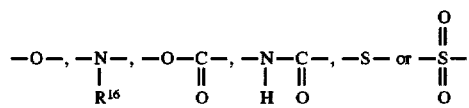

in the linking main chain of the ring; $R^{16}$ represents a hydrogen atom, a hydrocarbon group which may have a substituent and at the same time, may contain an unsaturated bond, or a substituted carbonyl group; $R^{17}$ and $R^{18}$, which may be the same or different, each represents a hydrogen atom or a hydrocarbon group which may have a substituent and at the same time, may contain an unsaturated bond or $R^{17}$ and $R^{18}$ may be combined with each other to form a ring and represent an alkylene group having from 2 to 8 carbon atoms which may contain

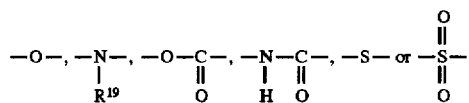

in the linking main chain of the ring; and $R^{19}$ represents a hydrogen atom, a hydrocarbon group which may have a substituent and may contain an unsaturated bond, or a substituted carbonyl group.

3. A photopolymerizable composition comprising at least the following components (i) and (ii):
   (i) a compound having an addition-polymerizable ethylenically unsaturated bond, and
   (ii) an oxime ether compound, wherein said oxime ether compound as component (ii) is a compound represented by formula (IV):

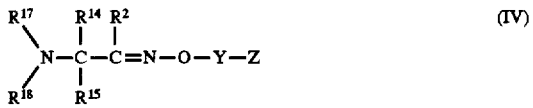

wherein $R^2$ represents a hydrocarbon group which may have a substituent and at the same time, may contain an unsaturated bond, or a heterocyclic group; $R^{14}$ and $R^{15}$, which may be the same or different, each represents a hydrogen atom, a hydrocarbon group which may have a substituent and at the same time, may contain an unsaturated bond, a heterocyclic group, a hydroxyl group, a substituted oxy group, a mercapto group, a substituted thio group, an amino group or a substituted amino group or $R^{14}$ and $R^{15}$ may be combined with each other to form a ring and represent an alkylene group having from 2 to 8 carbon atoms which may contain

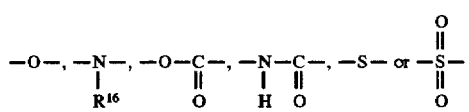

in the linking main chain of the ring; $R^{16}$ represents a hydrogen atom, a hydrocarbon group which may have a substituent and at the same time, may contain an unsaturated bond, or a substituted carbonyl group; $R^{17}$ and $R^{18}$, which may be the same or different, each represents a hydrogen atom or a hydrocarbon group which may have a substituent and at the same time, may contain an unsaturated bond or $R^{17}$ and $R^{18}$ may be combined with each other to form a ring and represent an alkylene group having from 2 to 8 carbon atoms which may contain

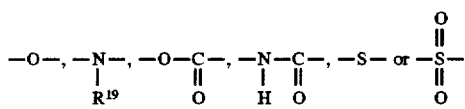

in the linking main chain of the ring; and $R^{19}$ represents a hydrogen atom, a hydrocarbon group which may have a substituent and may contain an unsaturated bond, or a substituted carbonyl group; Y represents a hydrocarbon linking group which may have a substituent and may contain an unsaturated bond; and Z represents an acid group having a pKa at the acid first dissociation of from 0 to 16, a precursor of the acid group, a conjugate base group of the acid group or a group resulting from substitution for a hydrogen atom dissociated from the acid group by a hydrocarbon group which may have a substituent.

* * * * *